United States Patent
Sawahata et al.

(10) Patent No.: US 8,270,450 B2
(45) Date of Patent: Sep. 18, 2012

(54) METHOD OF MANUFACTURING SEMICONDUCTOR LASER, SEMICONDUCTOR LASER, OPTICAL DISC DEVICE, METHOD OF MANUFACTURING SEMICONDUCTOR DEVICE, AND SEMICONDUCTOR DEVICE

(75) Inventors: Junji Sawahata, Miyagi (JP); Masaru Kuramoto, Kanagawa (JP); Osamu Goto, Kanagawa (JP)

(73) Assignee: Sony Corporation, Tokyo (JP)

( * ) Notice: Subject to any disclaimer, the term of this patent is extended or adjusted under 35 U.S.C. 154(b) by 81 days.

(21) Appl. No.: 12/956,435

(22) Filed: Nov. 30, 2010

(65) Prior Publication Data

US 2011/0134952 A1 Jun. 9, 2011

(30) Foreign Application Priority Data

Dec. 8, 2009 (JP) ................................. 2009-278245

(51) Int. Cl.
*H01S 3/08* (2006.01)
(52) U.S. Cl. .................... 372/103; 372/98; 372/46.01
(58) Field of Classification Search .................. 372/103, 372/98, 46.01
See application file for complete search history.

(56) References Cited

U.S. PATENT DOCUMENTS

| | | | |
|---|---|---|---|
| 4,686,679 A * | 8/1987 | Yano et al. | ............... 372/46.012 |
| 2002/0189531 A1 | 12/2002 | Dwillinski et al. | |
| 2004/0115847 A1 | 6/2004 | Hasegawa et al. | |
| 2004/0164308 A1 | 8/2004 | Asatuma et al. | |
| 2005/0018728 A1 | 1/2005 | Ohkubo | |
| 2005/0220157 A1 | 10/2005 | Nakamura et al. | |
| 2008/0240190 A1 * | 10/2008 | Kuramoto et al. | ......... 372/44.01 |

FOREIGN PATENT DOCUMENTS

| | | |
|---|---|---|
| JP | 2000-196188 | 7/2000 |
| JP | 2002-204036 | 7/2002 |
| JP | 2003-060298 | 2/2003 |
| JP | 2003-124572 | 4/2003 |
| JP | 2003-198057 | 7/2003 |
| JP | 2004-134555 | 4/2004 |
| JP | 2005-045009 | 2/2005 |
| JP | 2005-191588 | 7/2005 |
| JP | 2005-294394 | 10/2005 |
| JP | 2006-147814 | 6/2006 |
| JP | 2006-147815 | 6/2006 |
| JP | 2008-034587 | 2/2008 |
| JP | 2008-244423 | 10/2008 |
| WO | 03/036298 | 5/2003 |

* cited by examiner

*Primary Examiner* — Kinam Park
(74) *Attorney, Agent, or Firm* — SNR Denton US LLP

(57) ABSTRACT

A method of manufacturing a semiconductor laser having an end surface window structure includes the steps of forming a groove near at least the formation position of the end surface window structure of a substrate, and growing a nitride-based group III-V compound semiconductor layer including an active layer formed of a nitride-based group III-V compound semiconductor including at least In and Ga on the substrate.

19 Claims, 21 Drawing Sheets

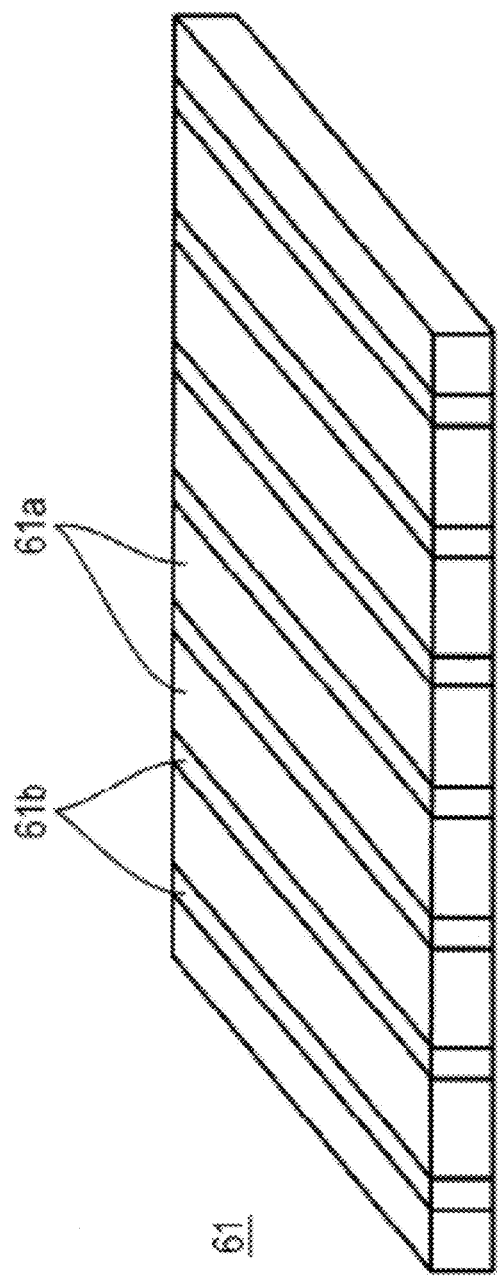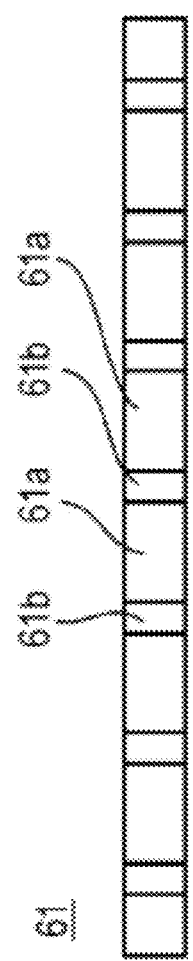
FIG. 19A
FIG. 19B

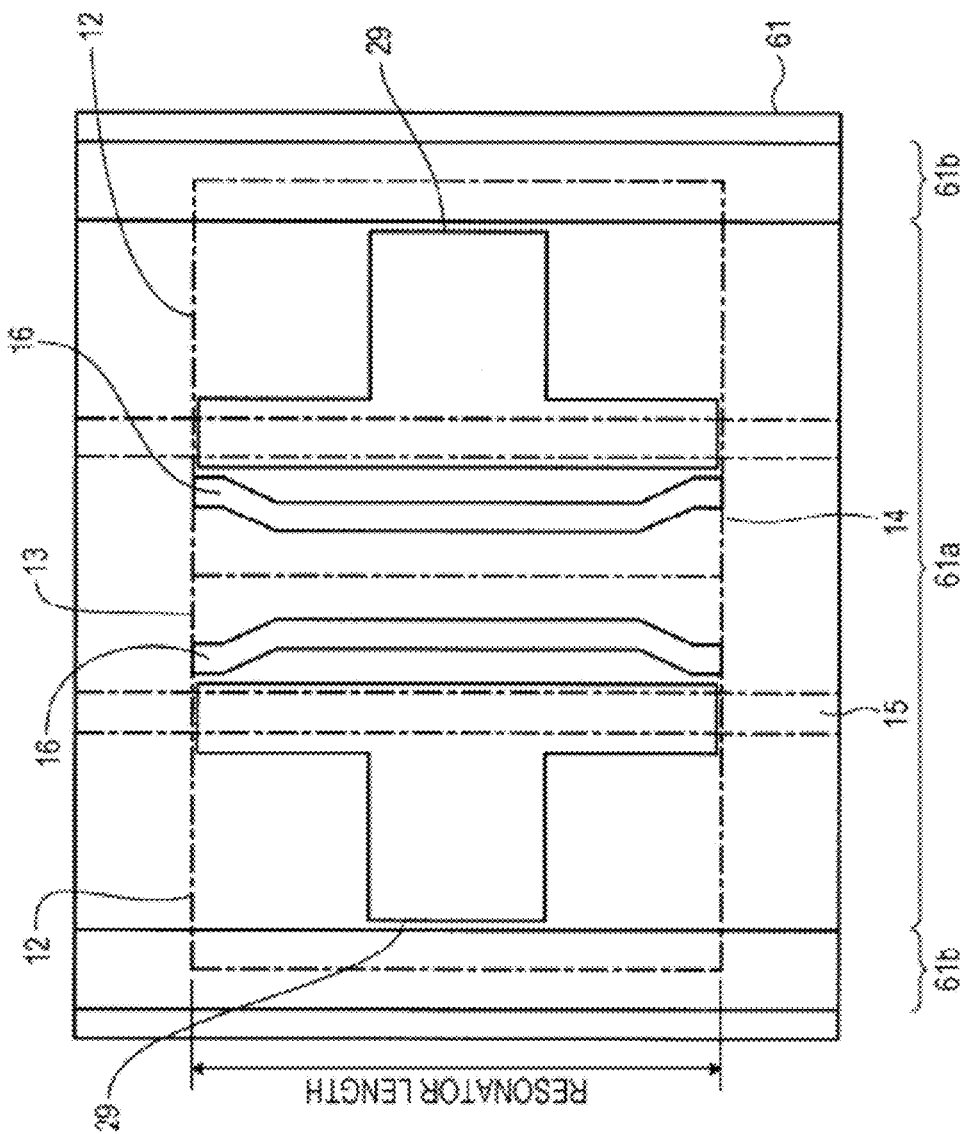

METHOD OF MANUFACTURING SEMICONDUCTOR LASER, SEMICONDUCTOR LASER, OPTICAL DISC DEVICE, METHOD OF MANUFACTURING SEMICONDUCTOR DEVICE, AND SEMICONDUCTOR DEVICE

BACKGROUND OF THE INVENTION

1. Field of the Invention

The present invention relates to a method of manufacturing a semiconductor laser, a semiconductor laser, an optical disc device, a method of manufacturing a semiconductor device, and a semiconductor device, and more particularly, to a ridge stripe-type semiconductor laser having an end surface window structure using a nitride-based group III-V compound semiconductor and an optical disc device using the semiconductor laser as a light source.

2. Description of the Related Art

In order to increase the maximum light output of a semiconductor laser, it is necessary that an end surface window structure be adopted in which a window that is transparent to light from an active layer is provided in a resonator end surface.

In a GaInP-based red light emission semiconductor laser of the related art, there is an effective method of forming an end surface window structure by diffusing Zn atoms in a semiconductor layer close to a portion, which will become the resonator end surface, after growth of a semiconductor layer forming a laser structure so as to locally increase band gap energy (for example, see Japanese Unexamined Patent Application Publication No. 2005-45009).

On the other hand, recently, in a high-density optical disc device or the like, a nitride-based group III-V compound semiconductor-based semiconductor laser has been used as a light source. Most of nitride-based group III-V compound semiconductors are materials which are thermally or mechanically stable, as compared with a GaInP-based semiconductor. To this end, with respect to a nitride-based group III-V compound semiconductor-based semiconductor laser, it is difficult to form an end surface window structure by a diffusion process of heterogeneous atoms and wet etching, which is effective in a GaInP-based red light emission semiconductor layer.

In a nitride-based group III-V compound semiconductor-based semiconductor laser, up to now, there have been proposals and experiments carried out on various methods of forming an end surface window structure. Hereinafter, the methods of forming the end surface window structure proposed up to now will be described.

A method has been proposed for forming an end surface window structure by increasing band gap energy near the resonator end surface using an In elimination phenomenon by $H_2$ plasma exposure or laser beam irradiation after a laser bar is formed by cleavage (for example, see Japanese Unexamined Patent Application Publication Nos. 2006-147814 and 2006-147815). However, since a high-vacuum chamber device is necessary in order to perform such a method, investment in equipment is extensive, and in the processing of the resonator end surface after cleavage, there are generally issues remaining with regard to productivity.

Numerous methods have been proposed for epitaxially growing a semiconductor layer forming a laser structure on a substrate, drilling a portion, which will become a resonator end surface, of this semiconductor layer using Reactive Ion Etching (RIE) and again epitaxially growing a nitride-based group III-V compound semiconductor layer with large band gap energy on that portion (for example, see Japanese Unexamined Patent Application Publication Nos. 2004-134555, 2003-60298, International Publication No. 03/036771, and Japanese Unexamined Patent Application Publication No. 2002-204036). However, in these methods, there is a concern that a surface level is formed on a surface drilled by using RIE and light absorption or local heat generation may occur during a laser operation.

In addition, as another example, a method has been proposed for forming an end surface window structure by epitaxially growing a semiconductor layer forming a laser structure on a substrate in which a geometric step difference is provided by RIE or insulating film deposition (for example, see Japanese Unexamined Patent Application Publication Nos. 2005-191588, 2005-294394, 2003-198057 and 2000-196188). In this method, it is intended that a cladding layer with large band gap energy operate as an end surface window structure compared with an active layer in the traveling direction of a laser beam. A representative example is shown in FIG. 25. As shown in FIG. 25, in this semiconductor laser, one main surface of a substrate 101 is patterned by RIE so as to provide a concave portion 101a, an n-type semiconductor layer 102, an active layer 103 and a p-type semiconductor layer 104 are sequentially grown thereon, and a p-side electrode 105, an isolation electrode 106 and a pad electrode 107 are formed on the p-type semiconductor layer 104. However, such a method has the following problems. That is, since a steep geometric step difference is generated in the n-type semiconductor layer 102, the active layer 103 and the p-type semiconductor layer 104 by the concave portion 101a of the substrate 101, optical waveguide loss occurs in the vicinity of the step difference. In addition, transparency by a wide gap of the active layer 103 near a resonator end surface is not intended and there is a possibility that a valid end surface window structure may not operate.

The present applicant first proposed a method of manufacturing a semiconductor laser having a window structure by forming a mask formed of an insulating film in the vicinity of at least a formation position of an end surface window structure on a substrate and then growing a nitride-based group III-V compound semiconductor layer including an active layer formed of a nitride-based group III-V compound semiconductor including at least In and Ga, in order to solve the drawbacks of the above-described method of forming the end surface window structure of the related art (see Japanese Unexamined Patent Application Publication No. 2008-244423).

SUMMARY OF THE INVENTION

However, according to an examination by the present inventors and the like, the method proposed in Japanese Unexamined Patent Application Publication No. 2008-244423 of manufacturing the semiconductor laser having the window structure has the following problems. That is, in the beginning of the crystal growth of the nitride-based group III-V compound semiconductor layer, a deposit is formed on the mask formed of the insulating film and this deposit is separated or absorbed into a surface during crystal growth and a processing step. As a result, there is deterioration in the manufacturing yield of the semiconductor laser, and defects in the shape of a far-field pattern of the semiconductor laser or the like.

It is desirable to provide a semiconductor laser using a nitride-based group III-V compound semiconductor and a method of manufacturing the same, where it is possible for an end surface window structure to be extremely simply formed, optical waveguide loss to be suppressed, light absorption or local heat generation during a laser operation due to the existence of a surface level to be suppressed, and a high manufacturing yield and a good far-field pattern shape to be realized.

It is also desirable to provide an optical disc device using the above-described semiconductor laser as a light source.

It is also desirable to provide a semiconductor device using a nitride-based group III-V compound semiconductor layer including at least In and Ga, which has a portion in which band gap energy is changed in at least one direction, and a method of manufacturing the same.

According an embodiment of the present invention, there is provided a method of manufacturing a semiconductor laser having an end surface window structure, the method including the steps of: forming a groove near at least a formation position of the end surface window structure of a substrate; and growing a nitride-based group III-V compound semiconductor layer including an active layer formed of a nitride-based group III-V compound semiconductor including at least In and Ga on the substrate.

According to another embodiment of the present invention, there is provided a semiconductor laser having an end surface window structure including: a substrate in which a groove is formed near a portion corresponding to at least the end surface window structure; and a nitride-based group III-V compound semiconductor layer including an active layer formed of a nitride-based group III-V compound semiconductor including at least In and Ga, which is grown on the substrate.

According to another embodiment of the present invention, there is provided an optical disc device using a semiconductor laser, which has an end surface window structure, in a light source, the optical disc device including: a substrate in which a groove is formed near a portion corresponding to at least the end surface window structure; and a nitride-based group III-V compound semiconductor layer including an active layer formed of a nitride-based group III-V compound semiconductor including at least In and Ga, which is grown on the substrate.

In the embodiments of the present invention, the substrate may be a conductive semiconductor substrate, and more particularly, a nitride-based group III-V compound semiconductor substrate (most typically, a GaN substrate) or a substrate obtained by growing at least one layer of the nitride-based group III-V compound semiconductor layer on a substrate formed (e.g., a sapphire substrate) of a material different from the nitride-based group III-V compound semiconductor. The width, the depth, the cross-sectional shape, the plan shape, the gap with the laser stripe, the position, and the like of a groove formed in the substrate may be appropriately determined according to characteristics or the like necessary for the semiconductor laser. Preferably, a side surface of the groove may be formed of a nitrogen terminating surface of the nitride-based group III-V compound semiconductor. For example, if the groove is formed in the nitride-based group III-V compound semiconductor substrate or the substrate obtained by growing the nitride-based group III-V compound semiconductor layer on the substrate formed of a material different from the nitride-based group III-V compound semiconductor, preferably, the side surface of the groove may be formed of the nitrogen terminating surface. To this end, this groove is formed to include a portion extending in a <1-100> direction or a <11-20> direction of the nitride-based group III-V compound semiconductor. If the groove is formed in the <1-100> direction, the side surface of this groove is formed of a {11-22} surface (for example, a (11-22) surface and a (-1-122) surface). If the groove is formed in the <11-20> direction, the side surface of this groove is formed of a {1-101} surface (for example, a (1-101) surface and a (-1101) surface). Both the {11-22} surface and the {1-101} surface are considered to be the nitrogen terminating surfaces.

The groove of the substrate is, for example, formed as follows. That is, for example, the groove may be formed along a formation position of a laser stripe on one side of the formation position of the laser stripe of the substrate, and at this time, a gap between the formation position of the laser stripe and the groove may be smaller than that of the other portion near the formation position of the end surface window structure. Alternatively, the groove may be formed along the formation position of a laser stripe on both sides of the formation position of the laser stripe of the substrate, and at this time, a gap between the formation position of the laser stripe and the groove may be smaller than that of the other portion near the formation position of the end surface window structure. Alternatively, the groove may be formed near the formation position of the end surface window structure and on one side or both sides of a formation position of a laser stripe. When the nitride-based group III-V compound semiconductor layer including the active layer is grown on the substrate in which the groove is formed, a relationship between the In composition x (or light emission wavelength λ) of the active layer of the laser stripe of a portion near the groove and the In composition y (light emission wavelength λ') of the active layer of the laser stripe of a portion not near the groove or a portion having a large distance between the groove and the laser stripe may be satisfied such that x<y (λ<λ'). In addition, the relationship between the thickness $t_1$ of the laser stripe of a portion near the groove and the thickness $t_2$ of the laser stripe of a portion not near the groove or a portion having a large distance between the groove and the laser stripe may be satisfied such that $t_2<t_1$.

The nitride-based group III-V compound semiconductor is generally formed of $Al_xB_yGa_{1-x-y-z}In_zAs_uN_{1-u-v}P_v$ (here, $0\leq x\leq 1$, $0\leq y\leq 1$, $0\leq z\leq 1$, $0\leq v\leq 1$, $0\leq x+y+z<1$, $0\leq u+v<1$). In detail, the nitride-based group III-V compound semiconductor is formed of $Al_xB_yGa_{1-x-y-z}In_zN$ (here, $0\leq x\leq 1$, $0\leq y\leq 1$, $0\leq z\leq 1$ $0\leq x+y+z<1$). Typically, the nitride-based group III-V compound semiconductor is formed of $Al_xGa_{1-x-z}In_zN$ (here, $0\leq x\leq 1$, $0\leq z\leq 1$) and is formed of, for example, GaN, InN, AlN, AlGaN, InGaN, or AlGaInN, but the present invention is not limited thereto. The nitride-based group III-V compound semiconductor including at least In and Ga is formed of $Al_xB_yGa_{1-x-y-z}In_zAs_uN_{1-u-v}P_v$ (here, $0\leq x\leq 1$, $0\leq y\leq 1$, $0\leq z\leq 1$, $0\leq u\leq 1$, $0\leq v\leq 1$, $0\leq x+y+z<1$, $0\leq u+v<1$). In detail, the nitride-based group III-V compound semiconductor including at least In and Ga is formed of $Al_xB_yGa_{1-x-y-z}In_zN$ (here, $0\leq x\leq 1$, $0\leq z\leq 1$, $0<x+y+z<1$). Typically, the nitride-based group III-V compound semiconductor including at least In and Ga is formed of $Al_xGa_{1-x-z}In_zN$ (here, $0\leq x\leq 1$, $0\leq z\leq 1$) and is formed of, for example, InGaN, or AlGaInN, but the present invention is not limited thereto. The nitride-based group III-V compound semiconductor layer may be typically grown by various epitaxial growth methods such as a Metalorganic Chemical Vapor Deposition (MOCVD) method, a Hydride Vapor Phase Epitaxy (HVPE) growth method, and a Molecular Beam Epitaxy (MBE) method, but the present invention is not limited thereto.

As the substrate, a nitride-based group III-V compound semiconductor substrate may be used in which a plurality of second regions extending in a linear shape, which have a second average dislocation density higher than a first average dislocation density in a first region formed of single crystal having the first average dislocation density, is periodically arranged so as to be parallel to one another. In this case, preferably, the groove may be formed line-symmetrically with respect to a center line of the first region near at least the formation position of the end surface window structure and on one side or both sides of the formation position of two or more laser stripes which are line-symmetrical with respect to the center line of the first region between two adjacent second regions of the nitride-based group III-V compound semiconductor substrate. Preferably, after the laser stripes are formed, a pad electrode electrically connected to the laser stripes may be formed in a region on an opposite side to the groove with respect to the laser stripes.

Preferably, a step is further included where there is at least partially or more preferably at least mostly filling a concave portion, which is formed on an upper portion of the groove by the growth of the nitride-based group III-V compound semiconductor layer, with an insulating material, after the nitride-based group III-V compound semiconductor layer including the active layer is grown on the substrate in which the groove is formed. Thus, a step difference due to the concave portion is reduced. Most preferably, the entire concave portion is filled with the insulating material so as to solve the step difference due to this concave portion such that the surface is planarized. By reducing or solving the step difference due to the concave portion, if an insulating film (for example, after a ridge which becomes a laser stripe is formed on an upper portion of the nitride-based group III-V compound semiconductor layer, a current narrowing insulating film formed on a portion including both sides of the ridge), an electrode or the like is formed in a subsequent step, it is possible to successfully form them without the occurrence of step disconnection or the like. The insulating material may be basically any material, and although not specially limited, may be formed of, for example, a coating-type insulating material such as Spin On Glass (SOG), various organic materials such as polyimide, various oxides such as $SiO_2$ or $Al_2O_3$ or various nitrides such as SiN. As this insulating material, a material not including siloxane is used. As the application type insulating material, for example, a phosphorus doped silicate-based inorganic SOG may be used.

The optical disc device includes a reproduction (reading) only disc, a recording (writing) only disc, or a reproduction and recording disc which is available, and a reproduction and/or recording method is specially regardless.

According to another embodiment of the present invention, there is provided a method of manufacturing a semiconductor device including the steps of forming a groove in a predetermined portion of a substrate; and growing a nitride-based group III-V compound semiconductor layer including at least In and Ga on the substrate.

According to another embodiment of the present invention, there is provided a semiconductor device including: a substrate in which a groove is provided in a predetermined portion; and a nitride-based group III-V compound semiconductor layer including at least In and Ga, in which band gap energy is changed in at least one direction along a surface of the substrate near the groove.

Any semiconductor device may be basically included if it is a semiconductor device in which the portion in which the band gap energy is changed in one direction is formed in the nitride-based group III-V compound semiconductor layer including at least In and Ga. In detail, in the semiconductor device, various elements such as an electron traveling element such as a FET are included in addition to a semiconductor light emitting element such as a semiconductor laser or a light emitting diode, and the configuration of the nitride-based group III-V compound semiconductor layer is appropriately designed according to such elements.

In the invention of the semiconductor device and the above method of manufacturing the semiconductor device, the other portions satisfy the description associated with the invention of the semiconductor laser and the method of manufacturing the semiconductor laser, unless it is counter to the characteristics of the invention.

In the invention of the semiconductor laser, the method of manufacturing the semiconductor laser and the optical disc device having the above-described configuration, when the groove is formed near the formation position of at least one end surface window structure in the substrate and the active layer is grown on the substrate, the diffusion length of In is extremely smaller than the diffusion length of Ga and thus the In composition of the active layer of the portion forming the end surface window structure is smaller than that of the other portion. In this case, since the concave portion is not formed in the portion of the substrate in which the laser stripe is formed in order to form the end surface window structure and it is possible to not form a steep step difference in the nitride-based group III-V compound semiconductor layer including the active layer by appropriately selecting the shape of the groove, it is possible to suppress optical waveguide loss. In addition, since the semiconductor layer of the portion forming the end surface window structure may not be drilled by RIE, a surface level is not formed and light absorption and local heat generation is prevented during laser operation. In addition, since at least a portion of the concave portion formed in the upper portion of the groove by the growth of the nitride-based group III-V compound semiconductor layer is filled with the insulating material such that it is possible for the step difference by the concave portion to be reduced, when the insulating film or the electrode is formed in the subsequent steps, it is possible to successfully form them without the occurrence of step disconnection.

In the invention of the method of the semiconductor device having the above-described configuration and manufacturing the semiconductor device, when the groove is formed near the portion corresponding to the portion, in which the band gap energy is changed, in the substrate and the nitride-based group III-V compound semiconductor layer is grown on the substrate, the diffusion length of In is extremely small compared to the diffusion length of Ga and thus the In composition of the nitride-based group III-V compound semiconductor of the portion near the groove is changed and the band gap energy is changed.

According to the embodiments of the present invention, it is possible to realize a semiconductor laser using a nitride-based group III-V compound semiconductor where it is possible for the end surface window structure to be extremely simply formed, optical waveguide loss to be suppressed, light absorption or local heat generation during laser operation to be suppressed, and a high manufacturing yield and a good far-field pattern shape to be realized. In addition, it is possible to realize a high-performance optical disc device by using the excellent semiconductor laser as a light source.

According to the embodiments of the present invention, it is possible to extremely simply grow a nitride-based group III-V compound semiconductor layer including at least In and Ga, which has a portion in which band gap energy is changed in at least one direction.

BRIEF DESCRIPTION OF THE DRAWINGS

FIGS. 19A and 19B are perspective views showing an n-type GaN substrate used in a method of manufacturing a GaN-based semiconductor laser according to an eighth embodiment of the present invention;

FIG. 22 is a plan view illustrating a method of manufacturing a GaN-based semiconductor laser according to a ninth embodiment of the present invention;

DESCRIPTION OF THE PREFERRED EMBODIMENTS

Hereinafter, modes (hereinafter, referred to as embodiments) for carrying out the present invention will be described. In addition, the description will be given in the following order.

1. First Embodiment (GaN-based Semiconductor Laser and Method of Manufacturing the Same)
2. Second Embodiment (GaN-based Semiconductor Laser and Method of Manufacturing the Same)
3. Third Embodiment (GaN-based Semiconductor Laser and Method of Manufacturing the Same)
4. Fourth Embodiment (GaN-based Semiconductor Laser and Method of Manufacturing the Same)
5. Fifth Embodiment (GaN-based Semiconductor Laser and Method of Manufacturing the Same)
6. Sixth Embodiment (GaN-based Semiconductor Laser and Method of Manufacturing the Same)
7. Seventh Embodiment (GaN-based Semiconductor Laser and Method of Manufacturing the Same)
8. Eighth Embodiment (GaN-based Semiconductor Laser and Method of Manufacturing the Same)
9. Ninth Embodiment (GaN-based Semiconductor Laser and Method of Manufacturing the Same)
10. Tenth Embodiment (GaN-based Light Emitting Diode and Method of Manufacturing the Same)

1. First Embodiment

GaN-Based Semiconductor Laser and Method of Manufacturing the Same

FIGS. 1 to 3C show a method of manufacturing a GaN-based semiconductor laser according to a first embodiment. This GaN-based semiconductor laser has an end surface window structure and a ridge stripe structure, in which a p-side electrode of a portion near a resonator end surface has been removed and both ends of the resonator are made to be current non-injection regions.

Figure 1:
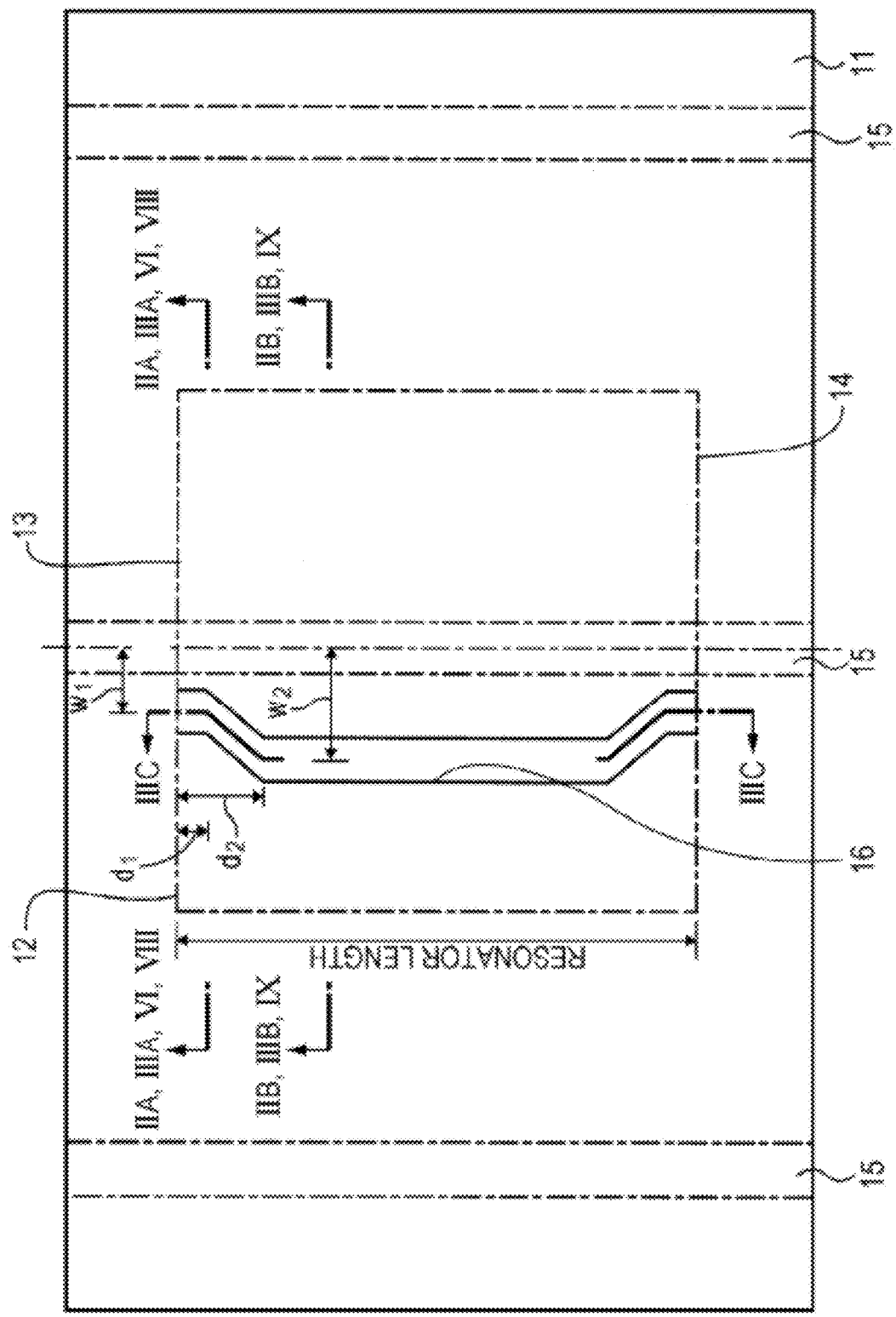
FIG. 1 is a plan view illustrating a method of manufacturing a GaN-based semiconductor laser according to a first embodiment of the present invention.
Figure 2A:
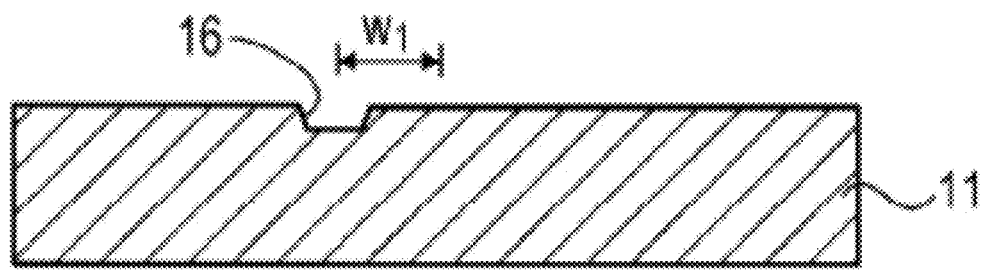
FIGS. 2A and 2B are cross-sectional views illustrating the method of manufacturing the GaN-based semiconductor laser according to the first embodiment of the present invention.
Figure 2B:
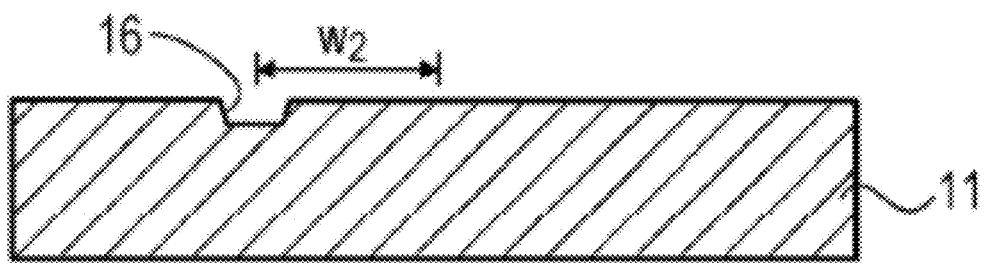

In the first embodiment, first, as shown in FIGS. 1, 2A and 2B, for example, a chip region 12, which is a region which will finally become a single laser chip, is defined on a (0001) surface (C surface) azimuth of an n-type GaN substrate 1. FIG. 1 is a plan view, FIG. 2A is a cross-sectional view taken along line IIA-IIA of FIG. 1, and FIG. 2B is a cross-sectional view taken along line IIB-IIB of FIG. 1. In the chip region 12, an elongated groove 16 is formed over the entire length of the resonator length direction near resonator end surface formation positions 13 and 14 where resonator end surfaces of the front side and the rear side are finally formed by cleavage or the like and on one side of a ridge stripe formation position 15 where a ridge stripe will be formed later. This groove 16 may be formed, for example, by etching the n-type GaN substrate 11 by Reactive Ion Etching (RIE) or the like using an etching mask formed of a $SiO_2$ film or the like. A gap between the center line of this groove 16 and the center line of the ridge stripe formation position 15 is $w_1$ in a portion from the resonator end surface formation positions 13 and 14 to a distance $d_1$, is gradually and linearly increased from $w_1$ to $w_2$ ($w_2 > w_1$) in a portion of the distance $d_1$ to $d_2$, and is $w_2$ in a central portion of the resonator length direction. An angle between the tapered portion of the distance $d_1$ to $d_2$ and the ridge stripe formation position 15 of this groove 16 is set to be 0 to 45°. Although the depth and the cross-sectional shape of this groove 16 are selected as necessary, for example, the depth is 0 to 10 μm, and typically 1 to 5 μm and the cross-sectional shape is an inverted trapezoidal shape, but the present invention is not limited thereto. The width of the parallel portion of the groove 16 parallel to the ridge stripe formation position 15 is, for example, 0 to 30 μm, and typically 5 to 20 μm, but the present invention is not limited thereto. In addition, for example, $w_1$ is 17 μm or less, for example, 13 to 15 μm, $w_2$ is 20 μm or more, for example, 60 μm, but the present invention is not limited thereto. For example, $d_1$ is 20 μm, $d_2$ is 50 μm, the width of the groove 16 is 10 μm, and the depth thereof is 3 μm.

In a side surface of the groove 16, before a GaN-based semiconductor layer forming at least a laser structure is epitaxially grown, a nitrogen terminating surface of a nitride-based group III-V compound semiconductor, for example, a {11-22} surface or a {1-101} surface is made to appear. To this end, for example, the ridge stripe formation position 15 is selected so as to extend in a <1-100> direction or a <11-20> direction of the n-type GaN substrate 11. If the ridge stripe formation position 15 is formed so as to extend in the <1-100> direction of the n-type GaN substrate 11, the side surface of this groove 16 is formed of the {11-22} surface. If the ridge stripe formation position 15 is formed so as to extend in the <11-20> direction of the n-type GaN substrate 11, the side surface of this groove 16 is formed of the {1-101} surface.

Although, in fact, there are the chip regions 12 repeatedly and periodically on the n-type GaN substrate 11 in the vertical and horizontal directions, only one chip region 12 is shown in FIG. 1. In addition, although, in fact, the groove 16 is formed over two or more chip regions 12 adjacent to each other in the resonator length direction, only the groove existing in one chip region 12 is shown in FIG. 1. The shape and the size of the chip region 12 shown in FIG. 1 are only exemplary and the present invention is not limited thereto.

Figure 3A:
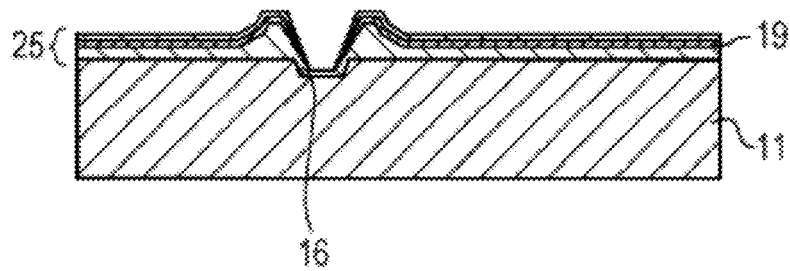
FIGS. 3A to 3C are cross-sectional views illustrating the method of manufacturing the GaN-based semiconductor laser according to the first embodiment of the present invention.
Figure 3B:
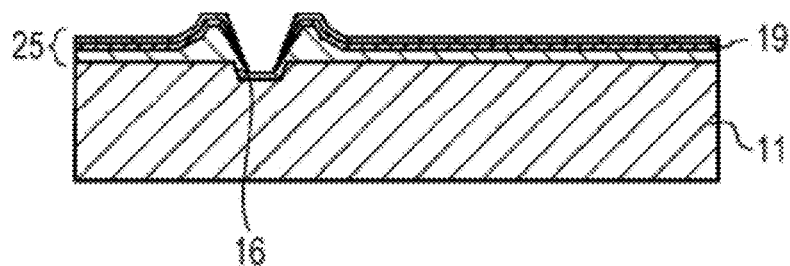
Figure 3C:
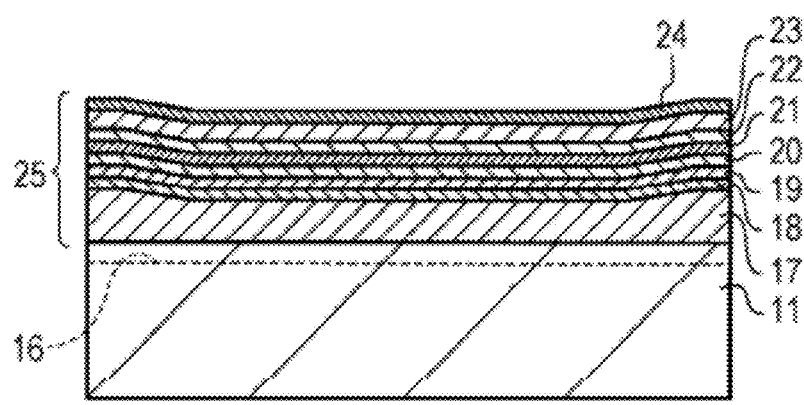

Next, as shown in FIGS. 3A, 3B and 3C, a GaN-based semiconductor layer is epitaxially grown on the n-type GaN substrate 11, in which the groove 16 is formed, for example, with a GaN buffer layer interposed therebetween, for example, by a Metalorganic Chemical Vapor Deposition (MOCVD) method. Here, FIG. 3A is a cross-sectional view taken along line IIIA-IIIA of FIG. 1, FIG. 3B is a cross-sectional view taken along line IIIB-IIIB of FIG. 1, and FIG. 3C is a cross-sectional view taken along line IIIC-IIIC (the center line of the groove 16) of FIG. 1. At this time, by setting a growth temperature of the GaN buffer layer to 1000° C. or more, in the side surface of the groove 16, a nitrogen terminating surface of the nitride-based group III-V compound semiconductor, for example, the {11-22} surface or the {1-101} surface may be made to appear as a stabilization surface. Then, the GaN-based semiconductor layer forming the laser structure may be epitaxially grown. As the GaN-based semiconductor layer forming the laser structure, in detail, an n-type AlGaN cladding layer 17, an n-type GaN optical waveguide layer 18, an active layer 19 of an undoped $Ga_{1-x}In_xN$ (quantum well layer)/$Ga_{1-y}In_yN$ (barrier layer, x>y) multiple quantum well structure, an undoped InGaN optical waveguide layer 20, an undoped AlGaN optical waveguide layer 21, a p-type AlGaN electronic barrier layer 22, a p-type GaN/udoped AlGaN superlattice cladding layer 23, and a p-type GaN contact layer 24 are sequentially epitaxially grown. Here, the growth temperature of the n-type AlGaN cladding layer 17, the n-type GaN optical waveguide layer 18, the undoped AlGaN optical waveguide layer 21, the p-type AlGaN electronic barrier layer 22, the p-type GaN/udoped AlGaN superlattice cladding layer 23, and the p-type GaN contact layer 24, all of which do not include In, is set to, for example, about 900 to 1100° C. and the growth temperature of the active layer 19 of the $Ga_{1-x}In_xN/Ga_{1-y}In_yN$ multiple quantum well structure and the undoped InGaN optical waveguide layer 20, both of which include In, is set to, for example, 700 to 800° C., but the present invention is not limited thereto. In addition, hereinafter, as necessary, such layers forming the laser structure are collectively referred to as a GaN-based semiconductor layer 25.

Although, as the growth material of such a GaN-based semiconductor layer, for example, triethylgallium $((C_2H_5)_3Ga$, TEG) or trimethylgallium $((CH_3)_3Ga$, TMG) is used as a material of Ga, trimethylaluminum $((CH_3)_3Al$, TMA) is used as a material of, triethylindium $((C_2H_5)_3In$, TEI) or trimethylindium $((CH_3)_3In$, TMI) is used as a material of In, ammonia $(NH_3)$ is used as a material of N, the present invention is not limited thereto. Although, as impurities, for example, silane $(SiH_4)$ is used as an n-type impurity, and for example, bis(methylcyclopentadienyl)magnesium $((CH_3C_5H_4)_2Mg))$, bis(ethylcyclopentadienyl)magnesium $((C_2H_5C_5H_4)_2Mg))$ or bis(cyclopentadienyl) magnesium $((C_5H_5)_2Mg))$ is used as a p-type impurity, the present invention is not limited thereto. In addition, although, for example, $H_2$ gas is used as a carrier gas atmosphere during the growth of the GaN-based semiconductor layer, the present invention is not limited thereto. Although a material flow ratio (V/III ratio) of the group V element to the group III element is generally $10^3$ to $10^6$ (for example, about $10^5$), the present invention is not limited thereto. In addition, although pressure during the growth is, for example, 760 Torr (normal pressure), the present invention is not limited thereto.

In this case, as described above, both side surfaces of the groove 16 are formed of nitrogen terminating surfaces, but the growth speed is generally slow in these nitrogen terminating surfaces. To this end, during the growth of the n-type AlGaN cladding layer 17, in addition to Al atoms and Ga atoms directly supplied from a growth material to the n-type GaN substrate 11 of the portion of the ridge stripe formation position 15, the Al atoms and the Ga atoms supplied from the growth material to the portion of the groove 16 are also diffused and supplied from the groove 16 to the outside thereof so as to contribute to growth. Here, the distance between the portion of the distance $d_1$ to $d_2$ from the resonator end surface formation positions 13 and 14 of the groove 16 and the center line of the ridge stripe formation position 15 is gradually and linearly decreased from $w_2$ to $w_1$ toward the resonator end surface formation positions 13 and 14. According to this, the amount of Al atoms and Ga atoms supplied from the groove 16 to the ridge stripe formation position 15 of this portion is gradually decreased toward the resonator end surface formation positions 13 and 14 in the resonator length direction. To this end, the thickness of the n-type AlGaN cladding layer 17 is gradually increased in this portion toward the resonator end surface formation positions 13 and 14 in the resonator length direction. On the other hand, the gap between the portion of the distance $d_1$ from the resonator end surface formation positions 13 and 14 of the groove 16 and the center line of the ridge stripe formation position 15 is a constant gap $w_1$, and thus the amount of Al atoms and Ga atoms supplied from the groove 16 to the ridge stripe formation position 15 of this portion is constant in the resonator length direction. To this end, the thickness of the n-type AlGaN cladding layer 17 becomes constant in this portion. In addition, the gap between the central portion, which excludes the portion of the distance $d_2$ from the resonator end surface formation positions 13 and 14 of the groove 16, and the center line of the ridge stripe formation position 15 is a constant gap $w_2$, and thus the amount of Al atoms and Ga atoms supplied from the groove 16 to the ridge stripe formation position 15 of this portion is constant in the resonator length direction. To this end, the thickness of the n-type AlGaN cladding layer 17 becomes constant in this portion. The same is true even in the n-type GaN optical waveguide layer 18.

On the other hand, at the time of the growth of the active layer 19 including In and Ga, in the ridge stripe formation position 15 of the portion near the groove 16, in addition to the In atoms and Ga atoms directly supplied from the growth material to this portion, the In atoms and Ga atoms supplied from the growth material onto the groove 16 of this portion are diffused and supplied to contribute to growth. In this case, since the diffusion length of the In atoms at the growth temperature (for example, 700 to 800° C.) of this active layer 19 is about one order of magnitude smaller than the diffusion length of the Ga atoms, the amount of In atoms supplied from the groove 16 to the ridge stripe formation position 15 of this portion becomes smaller than the amount of Ga atoms. In addition, the thicknesses of the n-type AlGaN cladding layer 17 and the n-type GaN optical waveguide layer 18 are decreased as the groove 16 gets further away. At this time, an inclined surface (see FIGS. 8 and 9) is generated in the upper surface of the n-type GaN optical waveguide layer 18. However, when the active layer 19 is grown on the n-type GaN optical waveguide layer 18, since the intake of In is decreased in this inclined surface, the amount of In atoms becomes smaller than the amount of Ga atoms. As a result, since the In composition of the active layer 19 is not uniform in the resonator length direction and the In composition of the portion corresponding to the portion of the distance $d_1$ from the resonator end surface formation positions 13 and 14 of the groove 16 becomes smaller than that of the other portion, the band gap energy of this portion becomes larger than the band gap energy of the other portion and thus this portion finally becomes a region of an end surface window structure. The growth of the undoped InGaN optical waveguide layer 20 is the same as that of the active layer 19.

The growth of the undoped AlGaN optical waveguide layer 21, the p-type AlGaN electronic barrier layer 22, the p-type GaN/updoped AlGaN superlattice cladding layer 23, and the p-type GaN contact layer 24 is the same as that of the n-type AlGaN cladding layer 17 and the n-type GaN optical waveguide layer 18.

Next, according to the method of manufacturing the semiconductor laser of the end surface current non-injection structure described in Japanese Unexamined Patent Application Publication No. 2008-34587, a ridge stripe is formed on the uppermost portion of the GaN-based semiconductor layer 25 on the ridge stripe formation position 15 and a p-side electrode is formed thereon. In addition, an isolation electrode and a pad electrode are formed in each chip region 12. Next, an n-side electrode is formed on a rear surface of the n-type GaN substrate 11 in each chip region 12.

Next, a laser bar is formed by cleaving the n-type GaN substrate 11, in which the laser structure is formed as described above, along the resonator end surface formation positions 13 and 14, thereby forming both resonator end surfaces. Next, after end surface coating is performed with respect to such resonator end surfaces, this laser bar is cleaved so as to form chips.

Accordingly, a desired GaN-based semiconductor laser is manufactured.

Figure 4A:
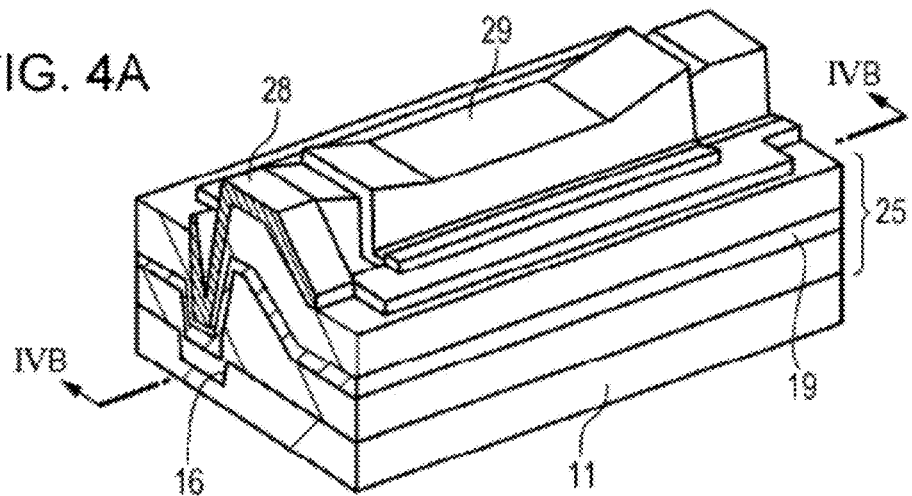
FIGS. 4A and 4B are a perspective view and a cross-sectional view showing a GaN-based semiconductor laser manufactured by the first embodiment of the present invention.
Figure 4B:
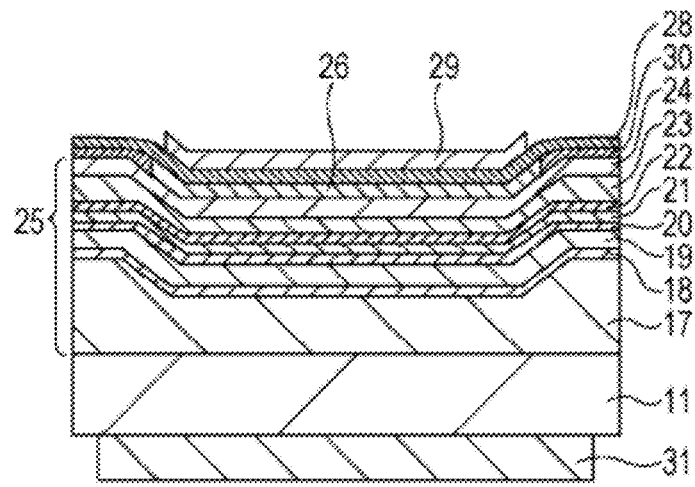
Figure 5:
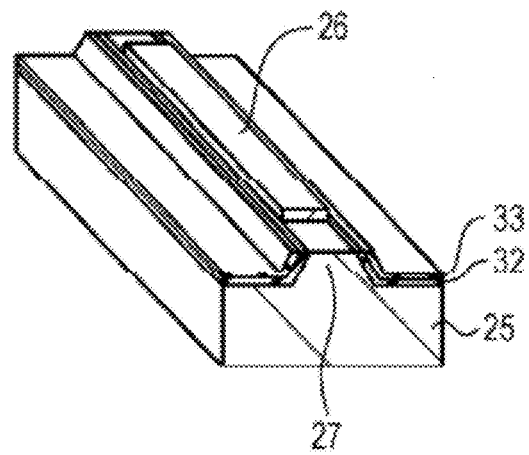
FIG. 5 is a perspective view showing a ridge stripe and a portion of a p-side electrode formed thereon of the GaN-based semiconductor laser manufactured by the first embodiment of the present invention.

The detailed structure of the GaN-based semiconductor laser manufactured by the above method is shown in FIGS. 4A and 4B. Here, FIG. 4A is a perspective view and FIG. 4B is a cross-sectional view taken along line IVB-IVB of FIG. 4A. FIG. 5 is an enlarged diagram showing the ridge stripe and the portion of the p-side electrode formed thereon.

In FIGS. 4A, 4B and 5, a reference numeral 26 denotes the p-side electrode, 27 denotes the ridge stripe, 28 denotes the isolation electrode, 29 denotes the pad electrode, 30 denotes an insulating film such as a $SiO_2$ film, and 31 denotes the n-side electrode. The p-side electrode 26 is formed of, for example, a Pd film and a Pt film formed thereon.

The ridge stripe 27 is, for example, formed on an upper layer portion of the p-type GaN/undoped AlGaN superlattice cladding layer 23 and the p-type GaN contact layer 24. The width of the ridge stripe 27 may be determined according to the characteristics necessary for this GaN-based semiconductor laser or the like and is generally, for example, about 1 to 20 µm (or about 1 to 12 µm), but the present invention is not limited thereto. In addition, the height of the ridge stripe 27 is, for example, 0.4 to 0.65 µm, but the present invention is not limited thereto.

As shown in FIG. 5, for example, an insulating film 32 such as a $SiO_2$ film and an insulating film 33 such as an undoped Si film formed thereon are formed so as to extend onto both side surfaces of the ridge stripe 27 and the outer portions of the ridge stripe 27.

The isolation electrode 28 is formed of, for example, a Ti/Pt/Ni film, and for example, the thickness of the Ti film of the lowermost layer is 10 nm, the thickness of the Pt film is 100 nm, and the thickness of the Ni film of the uppermost layer is 100 nm. However, the present invention is not limited thereto.

The pad electrode 29 is, for example, a Ti/Pt/Au film, and for example, the thickness of the Ti film of the lowermost layer is 10 nm, the thickness of the Pt film is 100 nm, and the thickness of the Au film of the uppermost layer is 300 nm. However, the present invention is not limited thereto.

Figure 6:
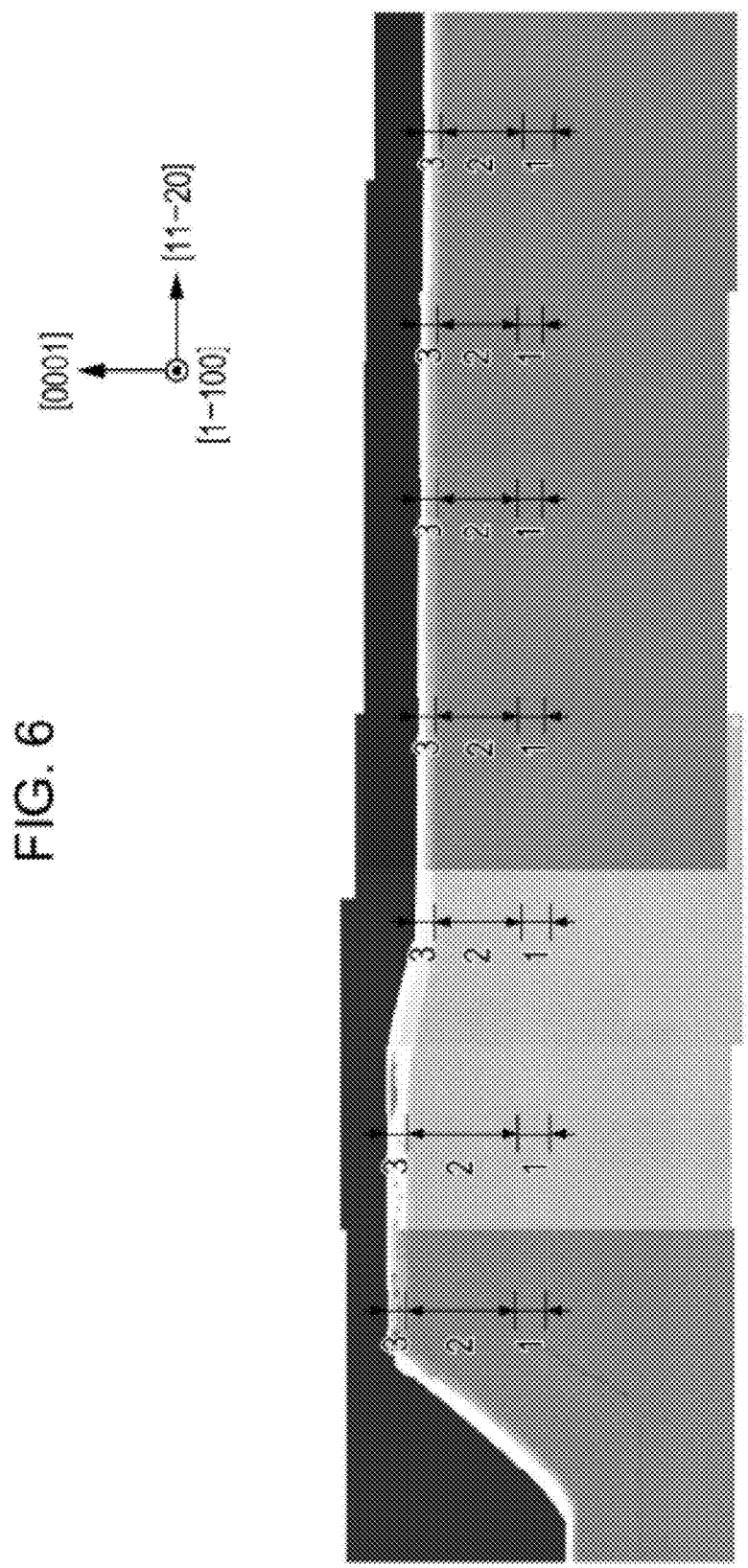
FIG. 6 is a drawing substitute photograph showing a GaN-based semiconductor layer grown on an n-type GaN substrate in the method of manufacturing the GaN-based semiconductor laser according to the first embodiment of the present invention.

FIG. 6 shows an end surface of a scanning electron micrograph (SEM) taken along line VI-VI of FIG. 1 of a sample obtained by growing the GaN-based semiconductor layer 25 on the n-type GaN substrate 11 in which the groove 16 is formed. The width of the groove 16 is 10 µm and the depth thereof is 3 µm. It can be seen from FIG. 6 that the thickness of the GaN-based semiconductor layer 25 is increased as the groove 16 becomes further away (the left end portion of the same drawing), becomes a constant thickness, then is decreased so as to form the inclined surface, and becomes a constant thickness again.

Figure 7:
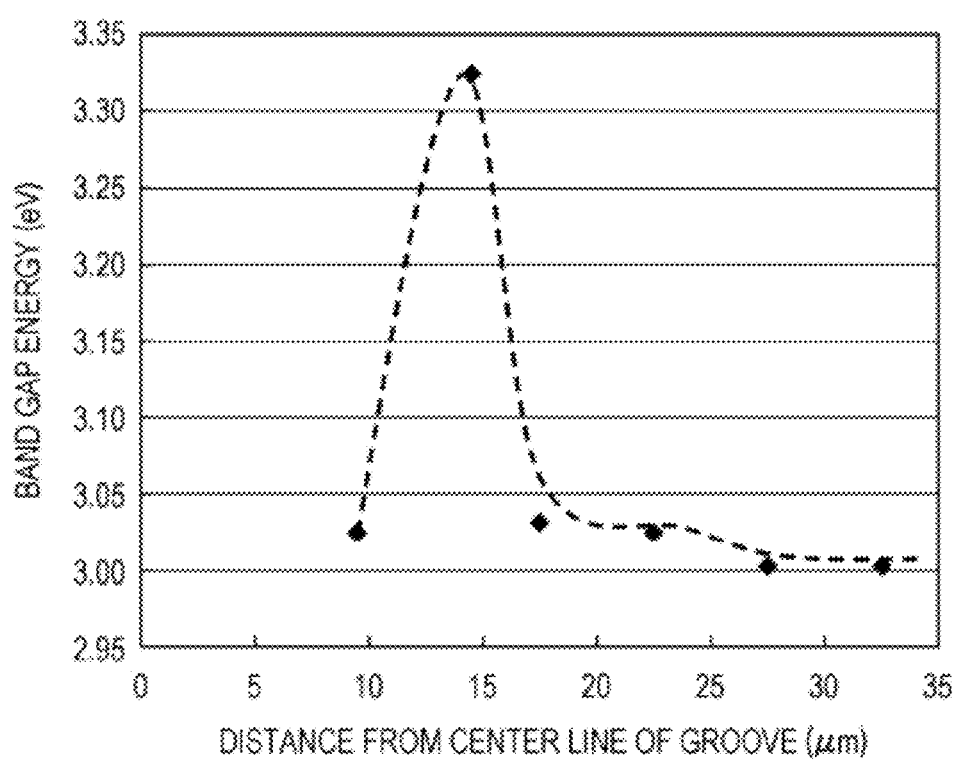
FIG. 7 is a diagrammatic view showing variation in distance from the center line of a groove with respect to band gap energy of an active layer grown on the n-type GaN substrate in the method of manufacturing the GaN-based semiconductor laser according to the first embodiment of the present invention.

FIG. 7 shows the result of measuring the band gap energy of the active layer 19 by changing the distance from the center line of the groove 16. As is obvious from FIG. 7, the band gap energy is largely increased at the position of a distance of about 10 to 17 μm from the center line of the groove 16 and this region is set to the vicinities of the end surface formation positions 13 and 14, thereby it is possible to form a window structure.

Figure 8:
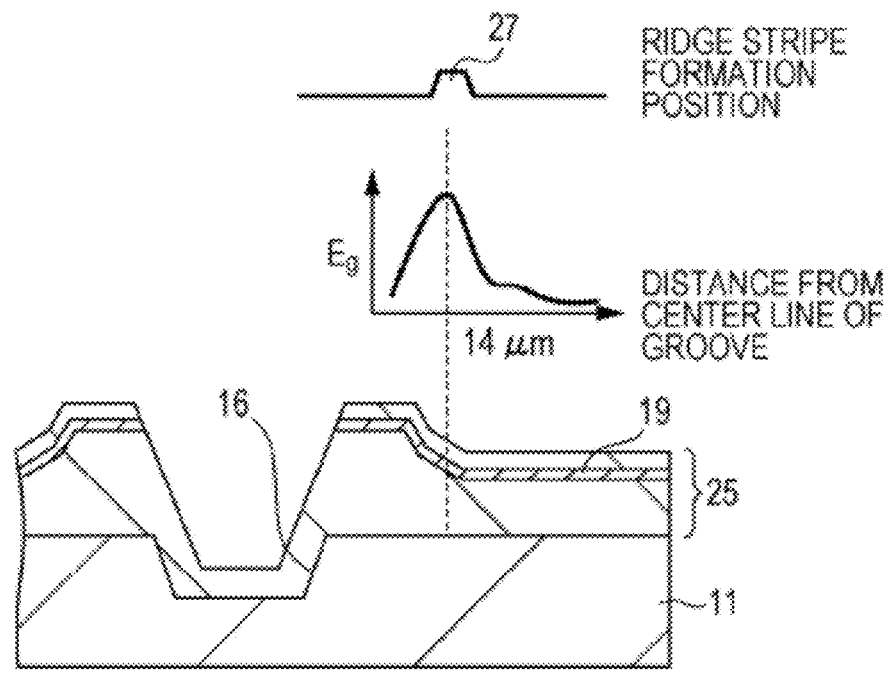
FIG. 8 is a diagrammatic view showing a cross-sectional shape of the GaN-based semiconductor layer grown on the n-type GaN substrate, the variation in distance from the center line of the groove with respect to the band gap energy of the active layer, and a formation position of the ridge stripe in the method of manufacturing the GaN-based semiconductor laser according to the first embodiment of the present invention.
Figure 9:
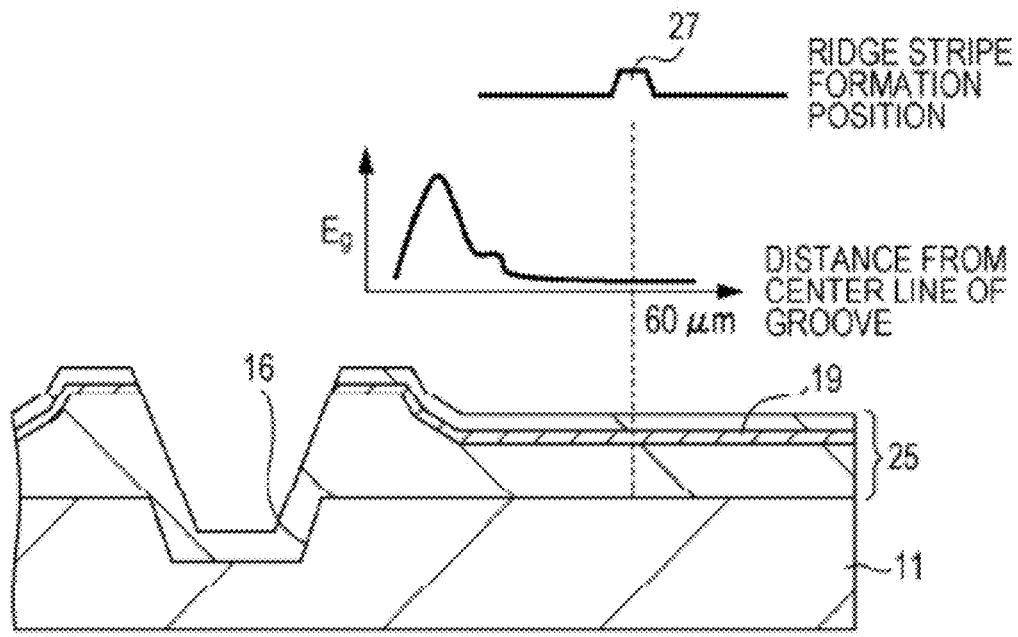
FIG. 9 is a diagrammatic view showing a cross-sectional shape of the GaN-based semiconductor layer grown on the n-type GaN substrate, the variation in distance from the center line of the groove with respect to the band gap energy of the active layer, and a formation position of the ridge stripe in the method of manufacturing the GaN-based semiconductor laser according to the first embodiment of the present invention.

The cross-sectional view of the end surface taken along line VIII-VIII of FIG. 1, the relationship between the distance from the center line of the groove 16 and the band gap energy ($E_g$) of the active layer 19, and the ridge stripe formation position are shown in FIG. 8. In addition, the cross-sectional view of the end surface taken along line IX-IX of FIG. 1, the relationship between the distance from the center line of the groove 16 and the band gap energy ($E_g$) of the active layer 19, and the ridge stripe formation position are shown in FIG. 9. As shown in FIGS. 8 and 9, the position of the peak value of the band gap energy substantially matches the ridge stripe 27 near the resonator end surface formation positions 13 and 14, but the band gap energy of the central portion of the ridge stripe 27 is decreased near the resonator end surface formation positions 13 and 14. Thus, it is possible to form the window structure near the resonator end surface formation positions 13 and 14.

According to the first embodiment, the following various advantages are obtained.

That is, since it is possible for the band gap energy of the active layer 19 of the portion near the resonator end surface formation positions 13 and 14 to be greater than that of the other portion by only forming the groove 16 in the n-type GaN substrate 11 and growing the GaN-based semiconductor layer 25 forming the laser structure thereon, it is possible to extremely easily form the end surface structure. In addition, unlike Japanese Unexamined Patent Application Publication No. 2008-244423, in the beginning of the crystal growth of the nitride-based group III-V compound semiconductor layer, there is no problem where a deposit is formed on a mask formed of an insulating film and this deposit is separated or absorbed into a surface during crystal growth and a processing step. To this end, it is possible to effectively prevent deterioration of the manufacturing yield of the GaN-based semiconductor laser, defects in the shape of a far-field pattern of the GaN-based semiconductor laser or the like.

Figure 25:
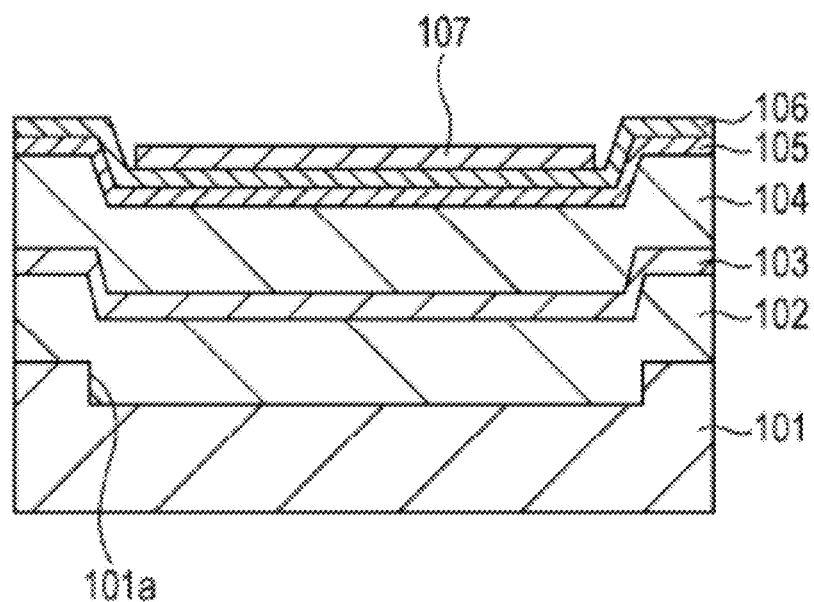
FIG. 25 is a cross-sectional view of a GaN-based semiconductor laser manufactured by a method of forming an end surface window structure of the related art.

In addition, since the thickness of the GaN-based semiconductor layer 25 is gradually increased toward the resonator end surface formation positions 13 and 14 in the resonator length direction in the portion of the distance $d_1$ to $d_2$ from the resonator end surface formation positions 13 and 14, a steep step difference is not generated. To this end, unlike the case in the semiconductor laser of the related art shown in FIG. 25 where the semiconductor layer forming the laser structure has a steep geometric step difference from the concave portion 101a to the outer portion thereof, it is possible to significantly suppress optical waveguide loss.

In addition, since the semiconductor layer forming the laser structure may not be drilled by RIE in order to form the end surface structure, a surface level is not formed when forming the end surface window structure and there is no light absorption and local heat generation during a laser operation due to this surface level.

In addition, according to the first embodiment, it is possible to realize a structure in which the ridge stripe 27 is formed to be self-aligned with respect to the stripe-shaped p-side electrode 26 and to easily manufacture the GaN-based semiconductor laser in which both end portions of the resonator are set to the current non-injection regions by removing the p-side electrode 26 of the portions near both resonator end surfaces (see Japanese Unexamined Patent Application Publication No. 2008-34587).

In this GaN-based semiconductor laser, since both ends of the resonator become the current non-injection regions, it is possible to effectively prevent Catastrophic Optical Damage (COD) of the resonator end surface, to realize long lifespan, and to improve reliability.

This GaN-based semiconductor laser is, for example, suitably used in a light source of an optical pickup of an optical disc device. The optical disc device includes a reproduction (reading) only disc, a recording (writing) only disc, or a reproduction and recording disc which is available, and any reproduction and/or recording method may be used.

2. Second Embodiment

GaN-Based Semiconductor Laser and Method of Manufacturing the Same

Figure 10:
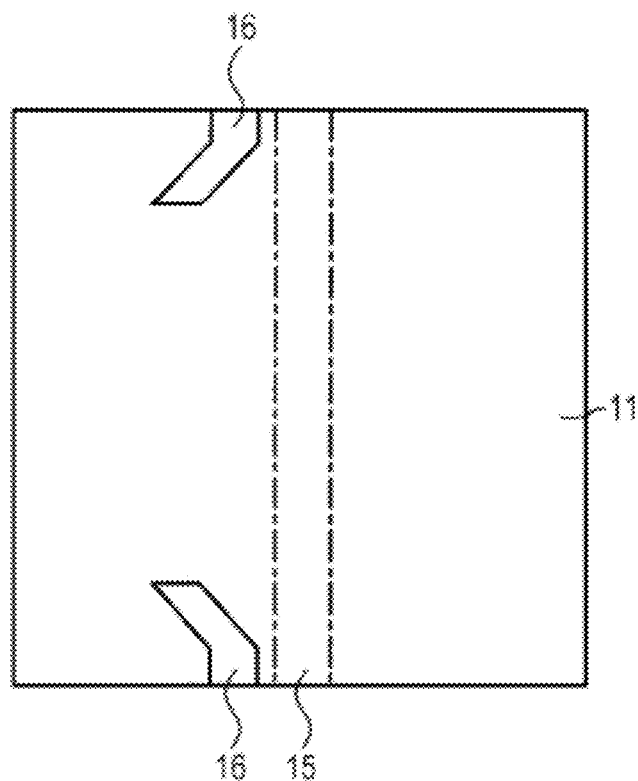
FIG. 10 is a plan view illustrating a method of manufacturing a GaN-based semiconductor laser according to a second embodiment of the present invention.

A second embodiment is different from the first embodiment in the pattern of the groove 16 formed in the n-type GaN substrate 11. In detail, as shown in FIG. 10, only a portion from the resonator end surface formation positions 13 and 14 of the groove 16 of the first embodiment to the distance $d_2$ is formed in the n-type GaN substrate 11.

Thereafter, the same steps as the first embodiment are performed so as to manufacture a desired GaN-based semiconductor laser.

According to the second embodiment, the same advantages as the first embodiment are obtained.

3. Third Embodiment

GaN-Based Semiconductor Laser and Method of Manufacturing the Same

Figure 11:
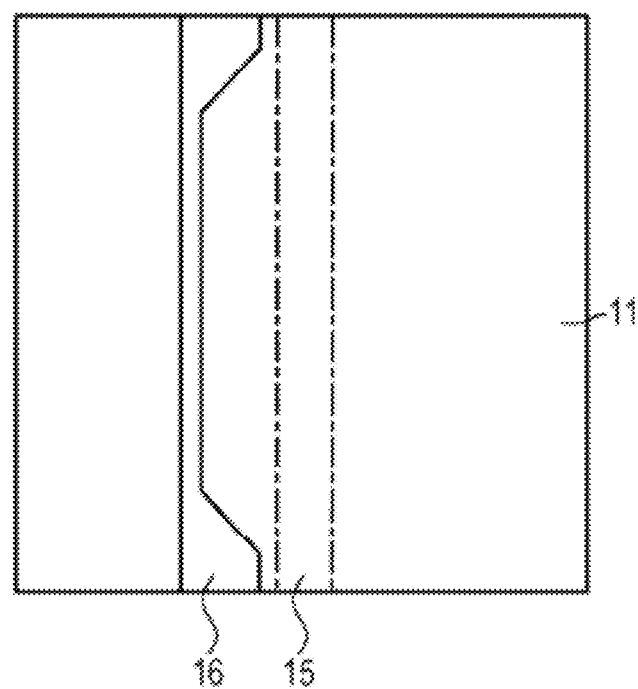
FIG. 11 is a plan view illustrating a method of manufacturing a GaN-based semiconductor laser according to a third embodiment of the present invention.

A third embodiment is different from the first embodiment in the pattern of the groove 16 formed in the n-type GaN substrate 11. In detail, as shown in FIG. 11, the groove 16 in which the contour of an edge of the ridge stripe formation position 15 side is equal to the contour of an edge of the ridge stripe formation position 15 side of the groove 16 in the first embodiment, and an edge of an opposite side of the ridge stripe formation position 15 is parallel to the ridge stripe formation position 15 is formed in the n-type GaN substrate 11.

Thereafter, the same steps as the first embodiment are performed so as to manufacture a desired GaN-based semiconductor laser.

According to the third embodiment, the same advantages as the first embodiment are obtained.

4. Fourth Embodiment

GaN-Based Semiconductor Laser and Method of Manufacturing the Same

Figure 12:
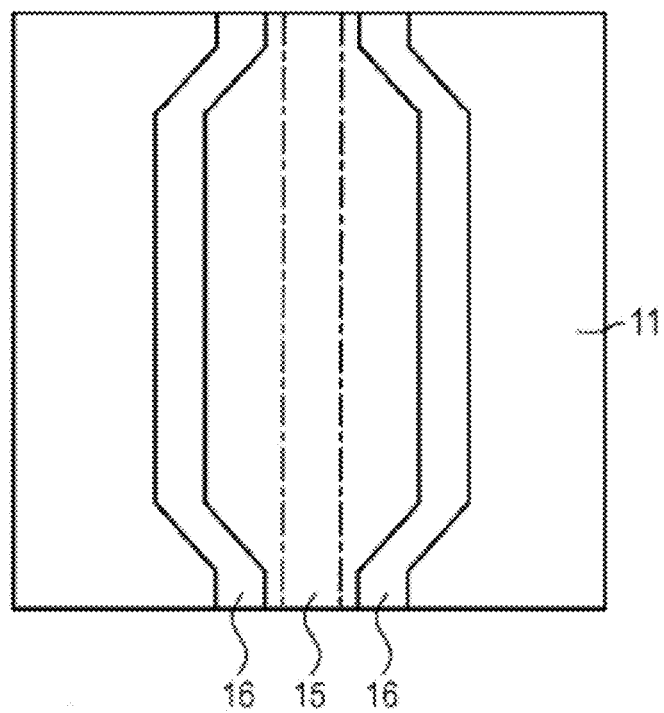
FIG. 12 is a plan view illustrating a method of manufacturing a GaN-based semiconductor laser according to a fourth embodiment of the present invention.

A fourth embodiment is different from the first embodiment in the pattern of the groove 16 formed in the n-type GaN substrate 11. In detail, as shown in FIG. 12, the grooves 16 of the first embodiment are formed at both sides of the ridge stripe formation position 15 in the n-type GaN substrate 11 so as to be line-symmetrical with respect to the ridge stripe formation position 15.

Thereafter, the same steps as the first embodiment are performed so as to manufacture a desired GaN-based semiconductor laser.

According to the fourth embodiment, the same advantages as the first embodiment are obtained.

5. Fifth Embodiment

GaN-Based Semiconductor Laser and Method of Manufacturing the Same

Figure 13:
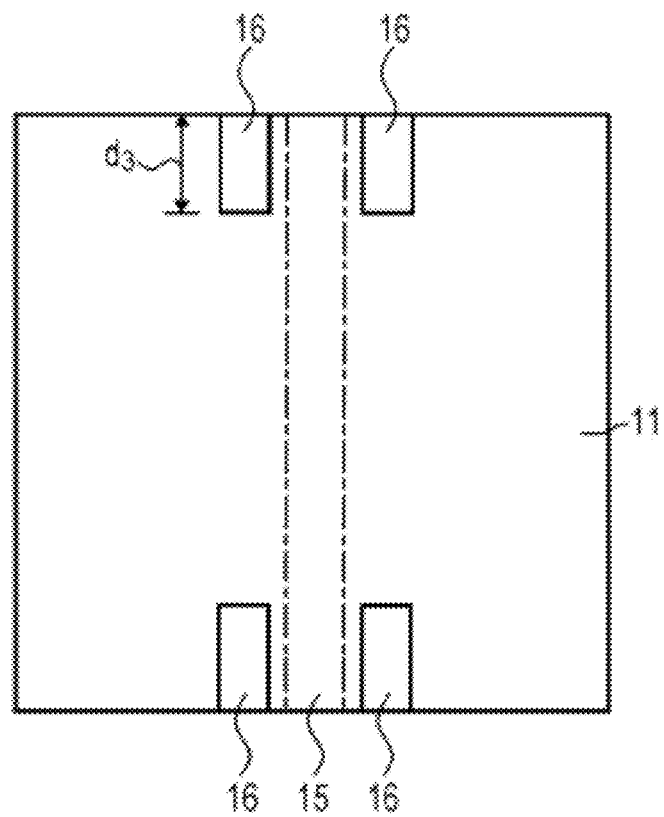
FIG. 13 is a plan view illustrating a method of manufacturing a GaN-based semiconductor laser according to a fifth embodiment of the present invention.

A fifth embodiment is different from the first embodiment in the pattern of the groove 16 formed in the n-type GaN substrate 11. In detail, as shown in FIG. 13, the grooves 16 having a rectangular plane shape are formed in the n-type GaN substrate 11 in the range of a distance $d_3$ from the resonator end surface formation positions 13 and 14 and at both sides of the ridge stripe formation position 15 so as to be line-symmetrical with respect to the ridge stripe formation position 15.

Thereafter, the same steps as the first embodiment are performed so as to manufacture a desired GaN-based semiconductor laser.

According to the fifth embodiment, the same advantages as the first embodiment are obtained.

6. Sixth Embodiment

GaN-Based Semiconductor Laser and Method of Manufacturing the Same

Figure 14:
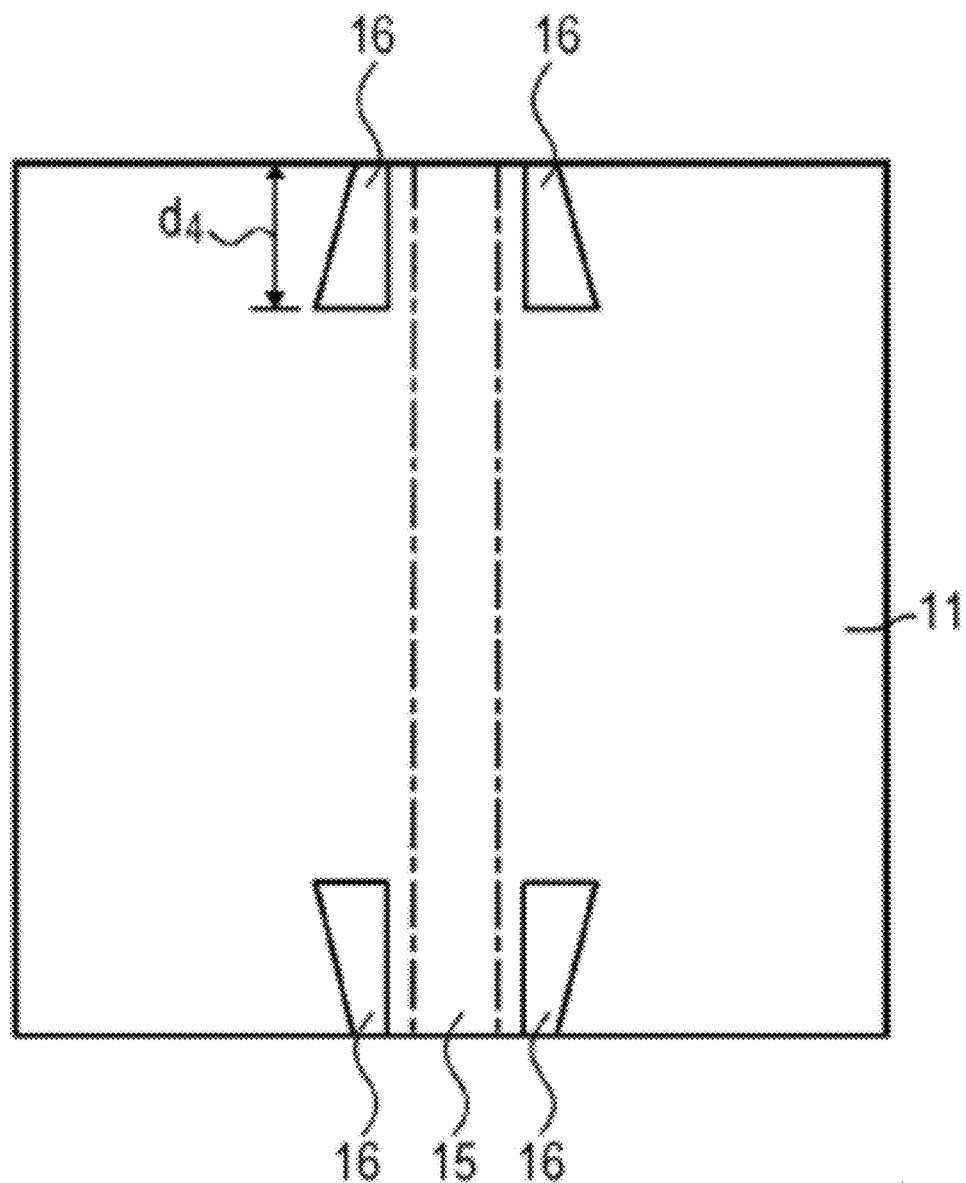
FIG. 14 is a plan view illustrating a method of manufacturing a GaN-based semiconductor laser according to a sixth embodiment of the present invention.

A sixth embodiment is different from the first embodiment in the pattern of the groove 16 formed in the n-type GaN substrate 11. In detail, as shown in FIG. 14, the grooves 16 having a trapezoidal plane shape are formed in the n-type GaN substrate 11 in the range of a distance $d_4$ from the resonator end surface formation positions 13 and 14 and at both sides of the ridge stripe formation position 15 so as to be line-symmetrical with respect to the ridge stripe formation position 15. The edges of the ridge stripe formation position 15 of these grooves 16 are parallel to the ridge stripe formation position 15. The width of the grooves 16 is linearly decreased from the width of the resonator end surface formation positions 13 and 14 to the width of the portion of the distance $d_4$. For example, $d_4$ is 20 to 50 µm, but the present invention is not limited thereto.

Thereafter, the same steps as the first embodiment are performed so as to manufacture a desired GaN-based semiconductor laser.

According to the sixth embodiment, the same advantages as the first embodiment are obtained.

7. Seventh Embodiment

GaN-Based Semiconductor Laser and Method of Manufacturing the Same

Figure 15:
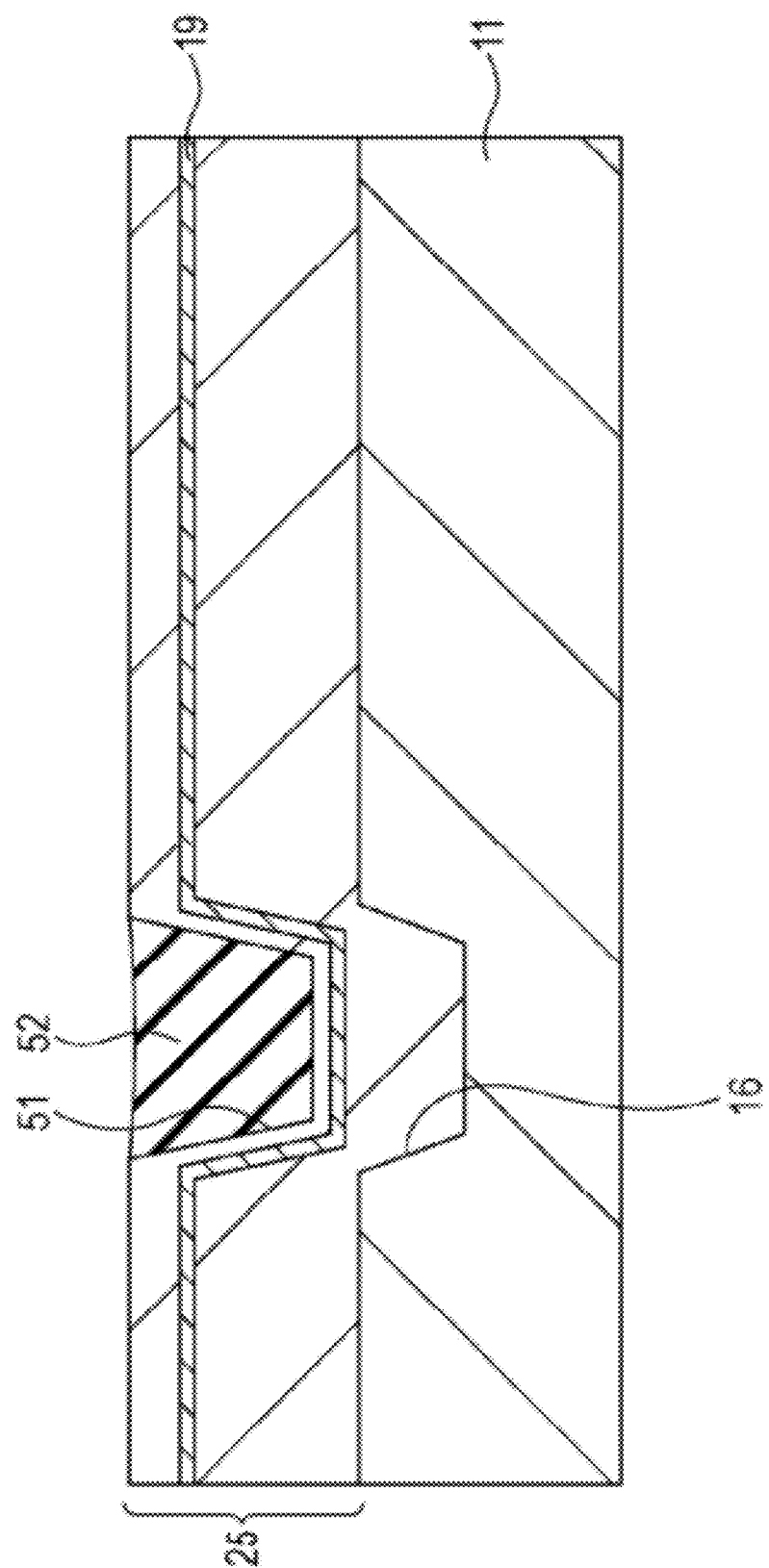
FIG. 15 is a cross-sectional view illustrating a method of manufacturing a GaN-based semiconductor laser according to a seventh embodiment of the present invention.

In a seventh embodiment, as shown in FIG. 15, the same steps as the first embodiment are performed, a GaN-based semiconductor layer 25, which forms the laser structure such as the active layer 19, is grown on the n-type GaN substrate 11, in which the groove 16 is formed, and then a concave portion 51, which is formed in an upper portion of the groove 16 by the growth of the GaN-based semiconductor layer 25, is filled with an insulating material 52 so as to planarize the surface. In detail, for example, phosphorus doped silicate-based inorganic SOG is spin coated as the insulating material 52 such that the concave portion 51 is filled with the insulating material 52, and thereafter, a solvent is removed by heat treatment so as to cause solidification. Alternatively, an organic material such as polyimide, $SiO_2$ or the like is formed on the entire surface as the insulating film 52 by a sputtering method, a vacuum deposition method or the like, the convex portion 51 is filled with the insulating material 52, and then this insulating film 52 is etched back until the GaN-based semiconductor layer 25 is exposed.

Figure 16:
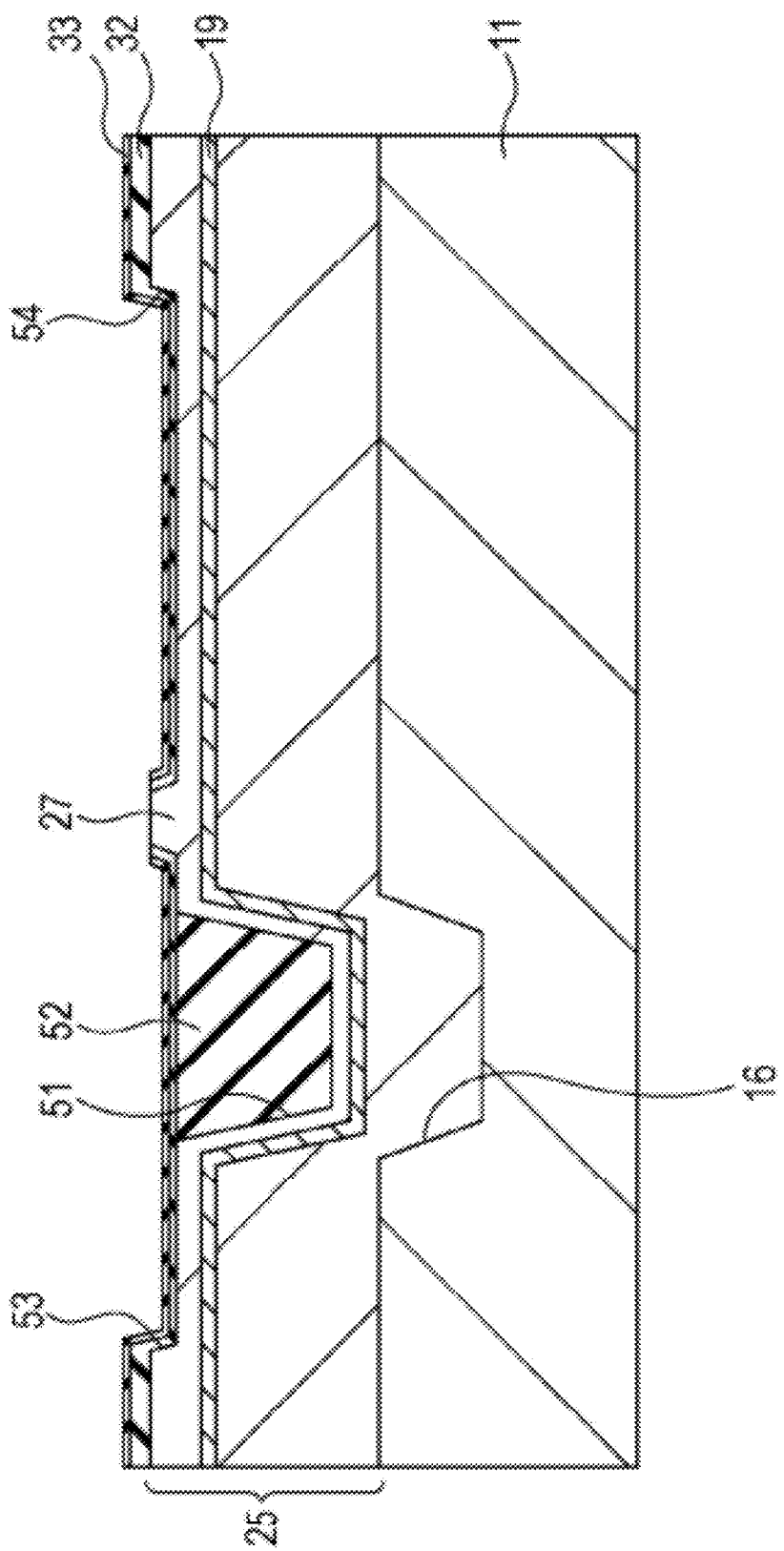
FIG. 16 is a cross-sectional view illustrating the method of manufacturing the GaN-based semiconductor laser according to the seventh embodiment of the present invention.

Next, as described above, after, for example, an insulating film (not shown) such as a $SiO_2$ film is formed on the planarized surface, this insulating film is patterned in a predetermined shape by etching. Next, as shown in FIG. 16, using this insulating film as an etching mask, the GaN-based semiconductor layer 25 is dry etched up to a predetermined depth by a RIE method using, for example, a chlorine-based etching gas so as to form grooves 53 and 54, and a ridge stripe 27 is formed between the grooves 53 and 54. Next, in a state in which the insulating film used as the etching mask remains, for example, an insulating film 32 such as a $SiO_2$ film, and for example, an insulating film 33 such as an undoped Si film are sequentially formed on the entire surface, and a resist pattern (not shown) having an opening in a portion corresponding to the ridge stripe 27 is formed thereon by lithography, and then the insulating films 32 and 33 in the portion on the ridge stripe 27 are selectively etched and removed using this resist pattern as a mask. Thereafter, the resist pattern is removed. Accordingly, the insulating films 32 and 33, the entirety of each being thick, are formed on the outer portions of the grooves 53 and 54. Here, the insulating film 32 of the outer portion of the grooves 53 and 54 includes the insulating film used as the etching mask.

Figure 17:
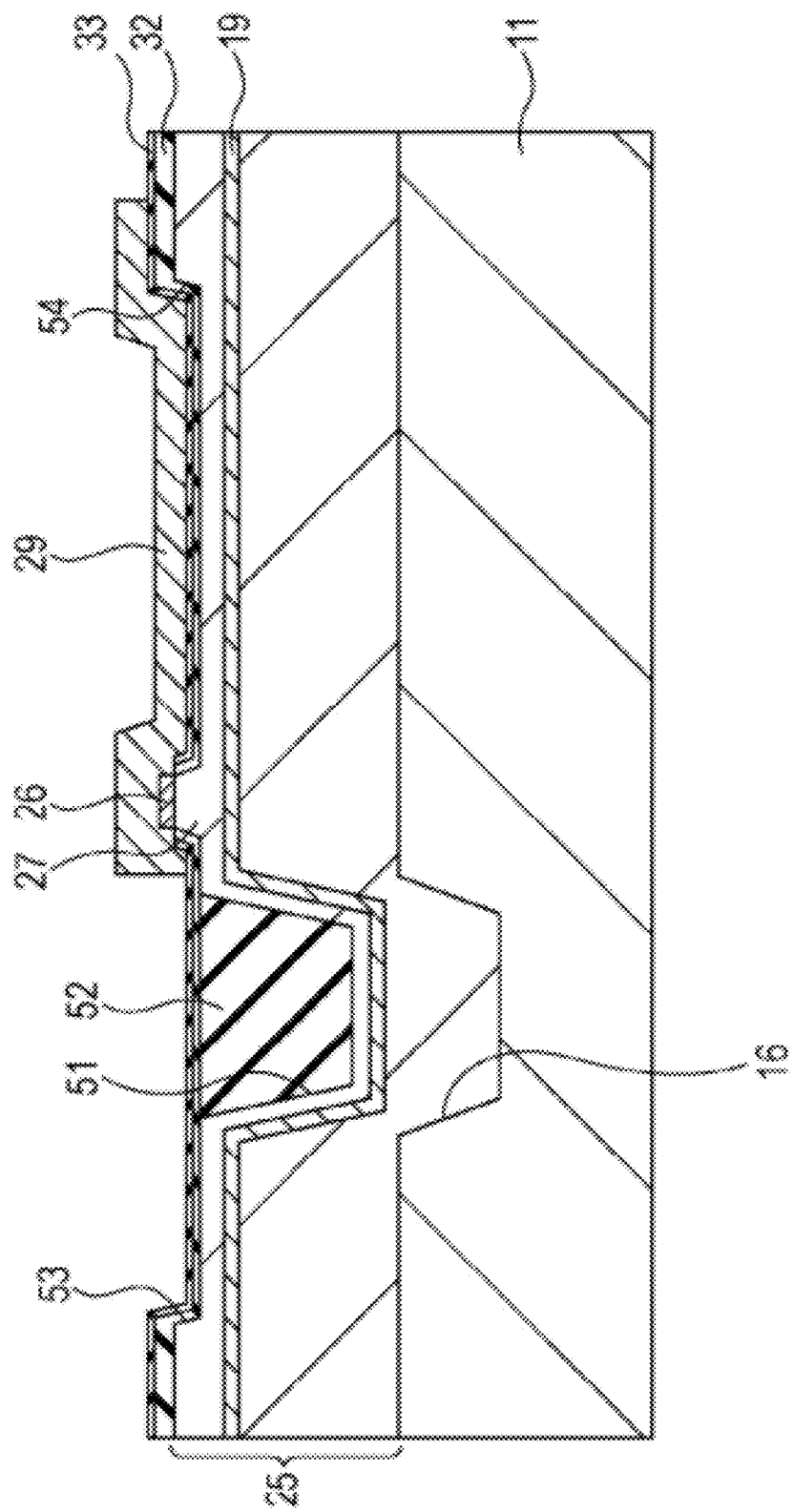
FIG. 17 is a cross-sectional view illustrating the method of manufacturing the GaN-based semiconductor laser according to the seventh embodiment of the present invention.
Figure 18:
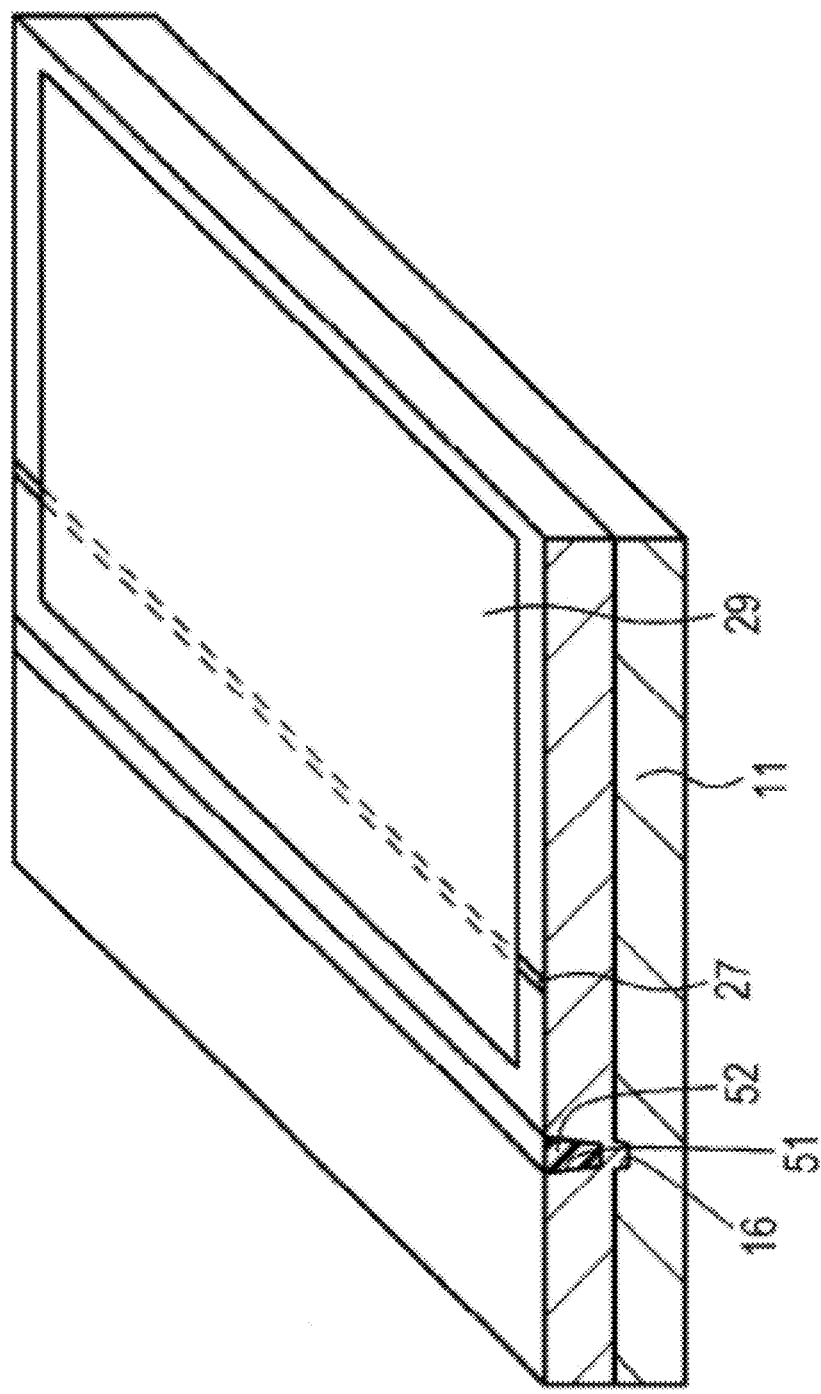
FIG. 18 is a perspective view illustrating the method of manufacturing the GaN-based semiconductor laser according to the seventh embodiment of the present invention.

Next, as shown in FIG. 17, the p-side electrode 26 is formed on the ridge stripe 27 and the pad electrode 29 is formed so as to cover the p-side electrode 26. The perspective view of this state is schematically shown in FIG. 18.

Thereafter, necessary steps are performed so as to manufacture a desired GaN-based semiconductor laser.

According to the seventh embodiment, in addition to the same advantages as the first embodiment, the following advantages are obtained. That is, the concave portion 51 formed in the upper portion of the groove 16 by the growth of the GaN-based semiconductor layer 25 on the n-type GaN substrate 11 of the portion in which the groove 16 is not formed is filled with the insulating material 52 so as to planarize the surface such that the step difference of the surface by the concave portion 51 is eliminated, when the insulating films 32 and 33 or the pad electrode 29 are formed in the subsequent steps, it is possible to successfully form the films or the electrode without the occurrence of step disconnection and to suppress the occurrence of leak current.

8. Eighth Embodiment

GaN-Based Semiconductor Laser and Method of Manufacturing the Same

In an eighth embodiment, an n-type GaN substrate 61 shown in FIG. 19 is used as a substrate used in the method of manufacturing the GaN-based semiconductor laser. The details of the n-type GaN substrate 61 and the method of manufacturing the same are described in Japanese Unexamined Patent Application Publication No. 2003-124572.

As shown in FIG. 19, in the n-type GaN substrate 61, a plurality of stripe-shaped second regions 61b formed of GaN and extending in a straight-line shape is periodically arranged in parallel with each other in a first region 61a formed of single crystal GaN.

The second regions 61b are formed of polycrystal, single crystal slightly inclined with respect to the first region 61a or single crystal in which a C axis is inverted with respect to the first region 61a. The first region 61a has a first average dislocation density and the second regions 61b have a second average dislocation density higher than the first average dislocation density. The second regions 61b penetrate through the n-type GaN substrate 61.

The average dislocation density of the second regions 61b is generally five or more times the average dislocation density of the first region 61a. Typically, the average dislocation density of the first region 61a is $2\times10^6$ cm$^{-2}$ or less and the average dislocation density of the second regions 61b is $1\times10^8$ cm$^{-2}$ or more. The width of the second regions 61b is generally 10 to 100 μm and typically 20 to 50 μm, but the present invention is not limited thereto.

Third regions may exist between the first region 61a and the second regions 61b as transition regions. The average dislocation density of the third regions is, typically less than $1\times10^8$ cm$^{-2}$ and is greater than $2\times10^6$ cm$^{-2}$.

The n-type GaN substrate 61, for example, has a (0001) surface (C surface) azimuth. In this case, the longitudinal direction of the second regions 61b is typically parallel to the <1-100> direction or the <11-20> direction of the n-type GaN substrate 61, but the present invention is not limited thereto. The thickness of the n-type GaN substrate 61 is selected as necessary and is generally, for example, 200 to 600 μm.

Figure 20:
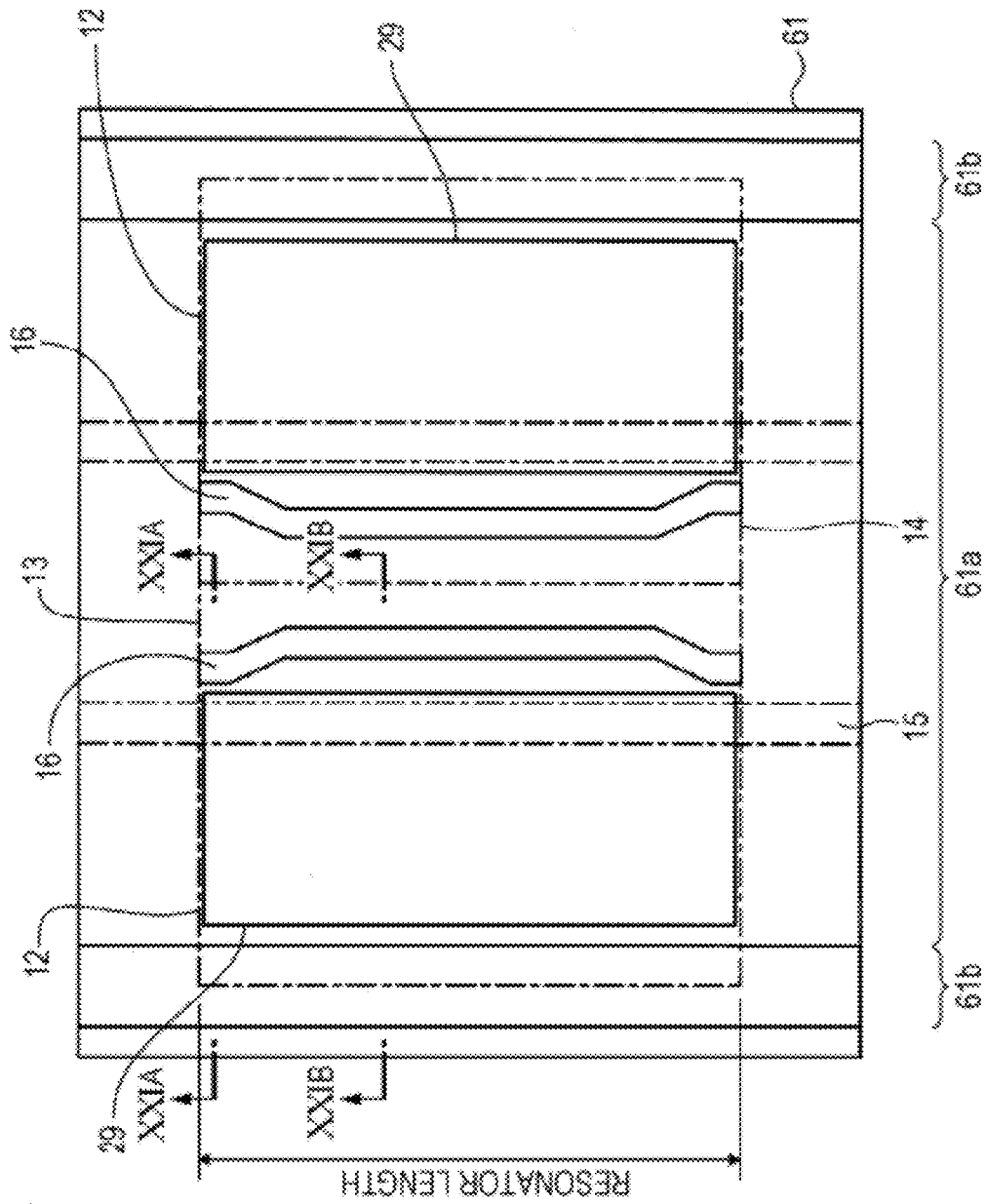
FIG. 20 is a plan view illustrating the method of manufacturing the GaN-based semiconductor laser according to the eighth embodiment of the present invention.
Figure 21A:
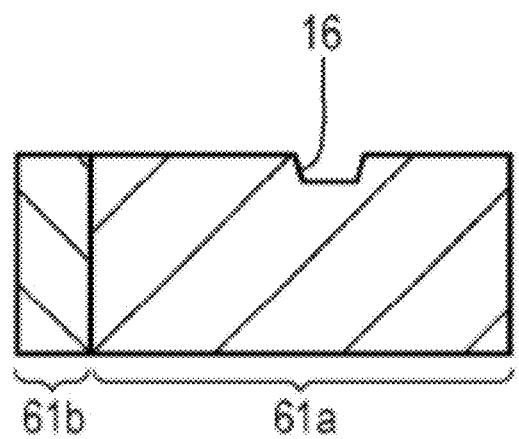
FIGS. 21A and 21B are cross-sectional views illustrating the method of manufacturing the GaN-based semiconductor laser according to the eighth embodiment of the present invention.
Figure 21B:
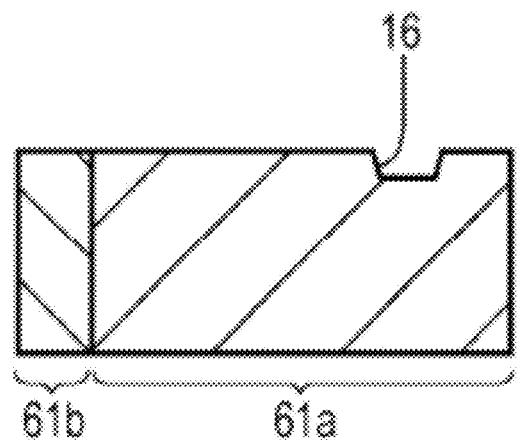

In the eighth embodiment, first, as shown in FIGS. 20, 21A and 21B, the chip region 12 which finally becomes one laser chip is defined on the n-type GaN substrate 61. Here, FIG. 20 is a plan view, FIG. 21A is a cross-sectional view taken along line XXIA-XXIA of FIG. 20, and FIG. 21B is a cross-sectional view taken along line XXIB-XXIB of FIG. 20.

In this case, the arrangement frequency of the second regions 61b (the distance between the center lines of two adjacent second regions 61b) is set to two times the width of the direction perpendicular to the resonator length direction of the chip region 12. Two chip regions 12 corresponding to two laser chips are defined between the center lines of two adjacent second regions 61b.

In the chip region 12, similar to the first embodiment, the grooves 16 are formed at both sides of the ridge stripe formation position 15. Here, the ridge stripe formation position 15 of the two adjacent chip regions 12 is line-symmetrical with respect to the center line of the first region 61a between two adjacent second regions 61b.

To this end, the distance between the ridge stripe formation position 15 and the second region 61b becomes equal between two chip regions 12. The finally formed ridge stripe is formed on the center line of the ridge stripe formation position 15.

The ridge stripe formation position 15 may be near the center line of the resonator length direction of the chip region 12, and in this case, is near the center line side of the first region 61a between two adjacent second regions 61b only by a predetermined distance. This predetermined distance is selected as necessary, but, for example, is about ⅓ of the distance between the center lines of the two adjacent second regions 61b.

The reason for this is because the ridge stripe formation position 15 is separated from the high-defective-density second region 61b with a high average dislocation density by a distance having no obstacle such that the ridge stripe is formed on the GaN-based semiconductor layer with as low a defect density as possible.

Thereafter, necessary steps are performed so as to perform a desired GaN-based semiconductor laser.

According to the eighth embodiment, in addition to the same advantages as the first embodiment, the following advantages are obtained. That is, since the two chip regions 12 are defined between the two adjacent second regions 61b of the n-type GaN substrate 61, it is possible to manufacture a plurality of GaN-based semiconductor lasers using one n-type GaN substrate 61. Accordingly, it is possible to reduce manufacturing cost of the GaN-based semiconductor laser.

9. Ninth Embodiment

GaN-Based Semiconductor Laser and Method of Manufacturing the Same

In a ninth embodiment, as shown in FIG. 22, the same steps as the eighth embodiment are performed and the GaN-based semiconductor layer 25 forming the laser structure such as the active layer 19 is grown on the n-type GaN substrate 61. In this GaN-based semiconductor layer 25, a concave portion is formed in an upper portion of the groove 16.

Next, the same steps as the seventh embodiments are performed, the concave portion of the GaN-based semiconductor layer 25 is filled with the insulating material so as to planarize the surface, the grooves 53 and 54 are formed in the GaN-based semiconductor layer 25, the ridge stripe 27 is formed between the grooves 53 and 54, the insulating films 32 and 33 are formed at both sides of the ridge stripe 27, the p-side electrode 26 is formed on the ridge stripe 27, and the pad electrode 29 is formed so as to cover the p-side electrode 26.

In this case, this pad electrode 29 includes a linear portion on the ridge stripe 27 and a rectangular portion formed to extend from the linear portion on the substantially flat surface of a region opposed to the groove 16 with respect to the ridge stripe 27.

The rectangular portion of the pad electrode 29 may be formed in any portion of the resonator length direction, but is formed on the central portion of the resonator length direction in FIG. 22. In addition, this pad electrode 29 is formed while avoiding the concave portion formed on the upper portion of the groove 16 and the upper portion of the second region 61b of the n-type GaN substrate 61.

If wire bonding is performed with respect to the pad electrode 29 at the time of mounting the GaN-based semiconductor laser, in order to secure a bonding region having a sufficient size, preferably, the width of the pad electrode 29 of a direction perpendicular to the resonator length direction is set to be, for example, 45 μm or more from the end of the ridge stripe 27.

Thereafter, necessary steps are performed so as to manufacture a desired GaN-based semiconductor laser.

According to the ninth embodiment, in addition to the same advantages as the eighth embodiment, the following advantages are obtained.

That is, since the pad electrode 29 is formed on the substantially flat surface of the region opposed to the groove 16 with respect to the ridge stripe 27, while avoiding the concave portion formed in the upper portion of the groove 16, by the growth of the GaN-based semiconductor layer 25 on the n-type GaN substrate 61, it is possible to successfully form the pad electrode 29 without the occurrence of step disconnection. Accordingly, it is possible to realize remarkable reduction of current leakage due to step disconnection of the pad electrode 29 or the like.

In addition, since the area of the pad electrode 29 is minimized, it is possible to reduce capacity of a parasitic capacitor formed by the pad electrode 29 and a lower layer structure of the pad electrode 29. Accordingly, it is advantageous when the GaN-based semiconductor laser is driven by a high-frequency current.

10. Tenth Embodiment

GaN-Based Light Emitting Diode and Method of Manufacturing the Same

Figure 23:
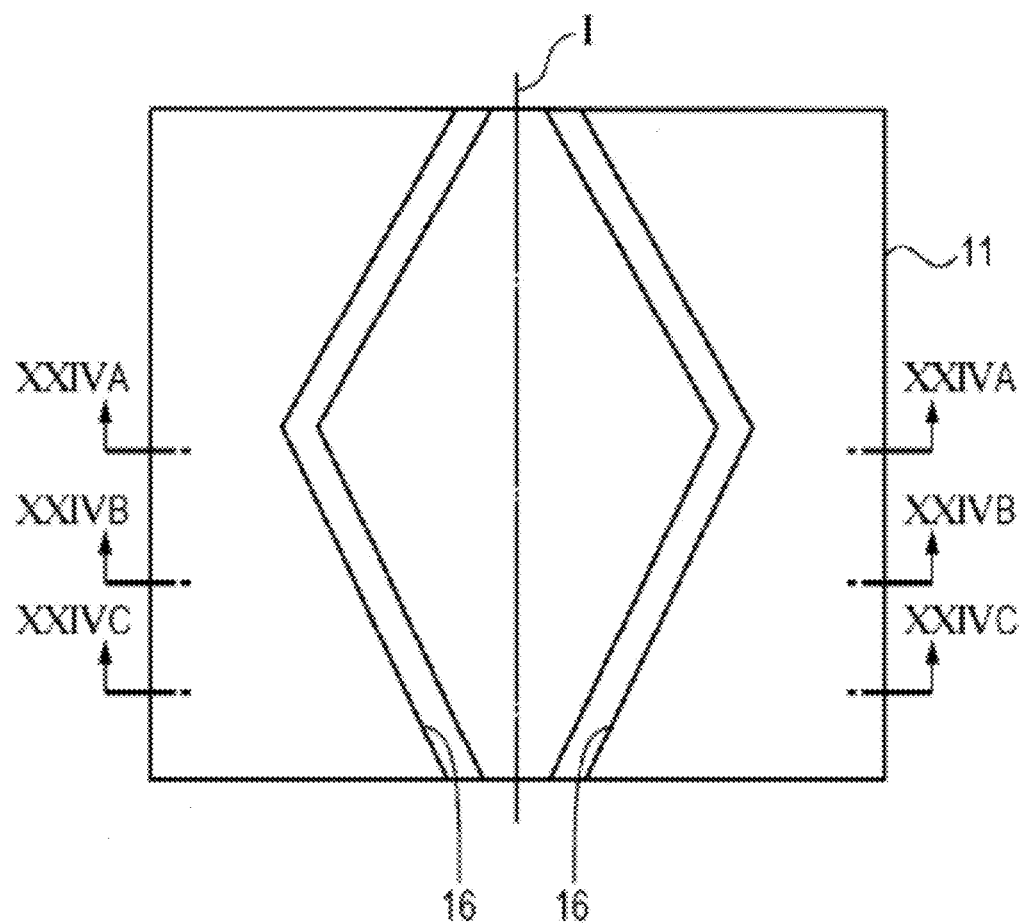
FIG. 23 is a plan view illustrating a method of manufacturing a GaN-based semiconductor laser according to a tenth embodiment of the present invention.

In a tenth embodiment, as shown in FIG. 23, two grooves 16 are formed in one chip region of the n-type GaN substrate 11 so as to be line-symmetrical with respect to a straight line I. A gap between the two grooves 16 is linearly increased or decreased in the direction of this straight line I.

In addition, the GaN-based semiconductor layer forming a light emitting diode structure is grown on the n-type GaN substrate 11 in which the grooves 16 are formed. In this GaN-based semiconductor layer, an active layer having the same composition as the active layer 19 of the GaN-based semiconductor laser according to the first embodiment is included. This GaN-based semiconductor layer is processed as necessary, a p-side electrode and an n-side electrode are formed, then the n-type GaN substrate 11 in which the light emitting diode structure is formed is cut into chips, and a desired GaN-based light emitting diode is manufactured.

Figure 24:
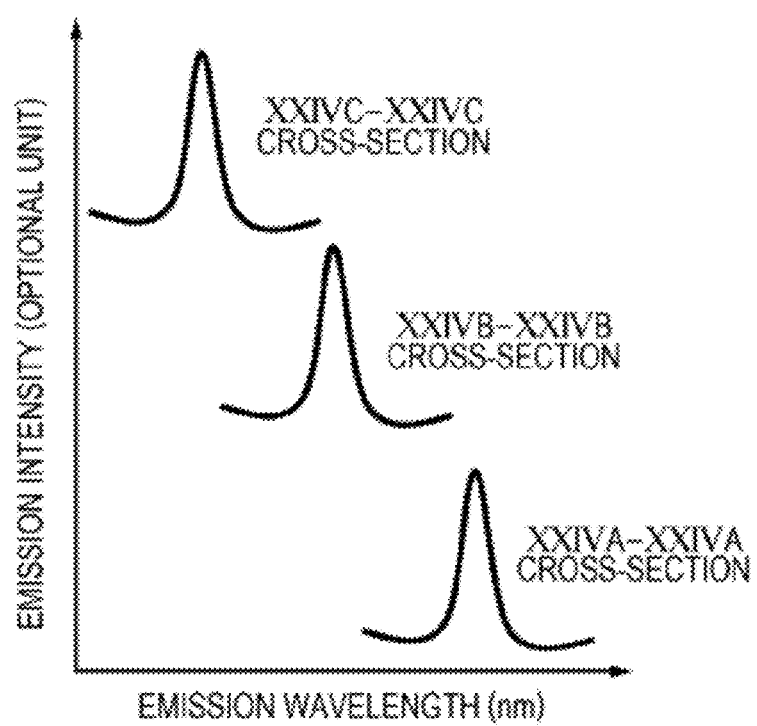
FIG. 24 is a diagrammatic view showing a distribution of a light emission wavelength of a GaN-based light emitting diode according to the tenth embodiment of the present invention.

In the active layer of the GaN-based light emitting diode, by changing the gap between the two grooves 16 in the direction of the straight line I, the In composition is changed by the mechanism described in the first embodiment, and as a result, the band gap energy and the light emission wavelength of the GaN-based light emitting diode are changed. For example, FIG. 24 shows a light emission spectrum of the XXIVA-XXIVA cross-section, XXIVB-XXIVB cross-section and XXIVC-XXIVC cross-section of FIG. 23. The light emission wavelengths of the cross sections are different from one another, and as the gap between the two grooves 16 is increased, the light emission wavelength is shortened.

According to the tenth embodiment, it is possible to realize a GaN-based light emitting diode with multiple light emission wavelengths. By using this GaN-based light emitting diode, it is possible to realize a white light emitting diode.

Although the embodiments of the present invention are described in detail, the present invention is not limited to the above-described embodiments and various modifications based on the technical concept of the present invention are possible.

For example, the numerical values, the structures, the substrates, the processes and the like of the above-described embodiments are only exemplary and the other numerical values, structures, substrates and processes and the like may be used as necessary.

In detail, as necessary, two or more of the above-described first to tenth embodiments may be combined.

The present application contains subject matter related to that disclosed in Japanese Priority Patent Application JP 2009-278245 filed in the Japan Patent Office on Dec. 8, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor laser having an end surface window structure, the method comprising the steps of:
   forming a groove near at least a formation position of the end surface window structure of a substrate; and
   growing a nitride-based group III-V compound semiconductor layer including an active layer formed of a nitride-based group III-V compound semiconductor including at least In and Ga on the substrate.

2. The method of manufacturing a semiconductor laser according to claim 1, wherein the substrate is a nitride-based group III-V compound semiconductor substrate or a substrate obtained by growing the nitride-based group III-V compound semiconductor layer on a substrate formed of a material different from the nitride-based group III-V compound semiconductor.

3. The method of manufacturing a semiconductor laser according to claim 2, wherein a side surface of the groove is formed of a nitrogen terminating surface of the nitride-based group III-V compound semiconductor.

4. The method of manufacturing a semiconductor laser according to claim 3, wherein the groove is formed along a formation position of a laser stripe on one side of the formation position of the laser stripe of the substrate, and at this time, a gap between the formation position of the laser stripe and the groove is smaller than that of the other portion near the formation position of the end surface window structure.

5. The method of manufacturing a semiconductor laser according to claim 3, wherein the groove is formed along a formation position of a laser stripe on both sides of the formation position of the laser stripe of the substrate, and at this time, a gap between the formation position of the laser stripe and the groove is smaller than that of the other portion near the formation position of the end surface window structure.

6. The method of manufacturing a semiconductor laser according to claim 3, wherein the groove is formed near the formation position of the end surface window structure and on one side or both sides of a formation position of a laser stripe.

7. The method of manufacturing a semiconductor laser according to claim 1, wherein the substrate is a nitride-based group III-V compound semiconductor substrate in which a plurality of second regions, which extend in a linear shape and have a second average dislocation density higher than a first average dislocation density in a first region formed of single crystal having the first average dislocation density, are periodically arranged so as to be parallel to one another, and the groove is formed line-symmetrically with respect to a center line of the first region near at least the formation position of the end surface window structure and on one side or both sides of the formation position of two or more laser stripes which are line-symmetrical with respect to the center line of the first region between two adjacent second regions of the nitride-based group III-V compound semiconductor substrate.

8. The method of manufacturing a semiconductor laser according to claim 7, wherein, after the laser stripes are formed, a pad electrode electrically connected to the laser stripes is formed in a region on an opposite side of the groove with respect to the laser stripes.

9. A semiconductor laser having an end surface window structure comprising:
   a substrate in which a groove is formed near a portion corresponding to at least the end surface window structure; and a nitride-based group III-V compound semiconductor layer including an active layer formed of a nitride-based group III-V compound semiconductor including at least In and Ga, which is grown on the substrate.

10. The semiconductor laser according to claim 9, wherein the substrate is a nitride-based group III-V compound semiconductor substrate or a substrate obtained by growing the nitride-based group III-V compound semiconductor layer on a substrate formed of a material different from the nitride-based group III-V compound semiconductor.

11. The semiconductor laser according to claim 10, wherein a side surface of the groove is formed of a nitrogen terminating surface of the nitride-based group III-V compound semiconductor.

12. The semiconductor laser according to claim 11, wherein the groove is formed along a formation position of a laser stripe on one side of the formation position of the laser stripe of the substrate, and a gap between the formation position of the laser stripe and the groove is smaller than that of the other portion near the formation position of the end surface window structure.

13. The semiconductor laser according to claim 11, wherein the groove is formed along a formation position of a laser stripe on both sides of the formation position of the laser stripe of the substrate, and a gap between the formation position of the laser stripe and the groove is smaller than that of the other portion near the formation position of the end surface window structure.

14. The semiconductor laser according to claim 11, wherein the groove is formed near the formation position of the end surface window structure and on one side or both sides of the formation position of a laser stripe.

15. The semiconductor laser according to claim 11, wherein a pad electrode electrically connected to a laser stripe is formed in a region on the opposite side to the groove with respect to the laser stripe.

16. The semiconductor laser according to claim 11, wherein the substrate is a nitride-based group III-V compound semiconductor substrate including a first region formed of single crystal having a first average dislocation density and second regions having a second average dislocation density higher than the first average dislocation density, in which the second regions are provided along one side parallel to a resonator length direction, and the groove is formed line-symmetrically with respect to the center line of the first region near at least the formation position of the end surface window structure and on one side or both sides of the formation position of each of two or more laser stripes which are line-symmetrical with respect to the center line of the first region between two adjacent second regions of the nitride-based group III-V compound semiconductor substrate.

17. An optical disc device using a semiconductor laser, which has an end surface window structure, as a light source, the optical disc device comprising:
    a substrate in which a groove is formed near a portion corresponding to at least the end surface window structure; and
    a nitride-based group III-V compound semiconductor layer including an active layer formed of a nitride-based group III-V compound semiconductor including at least In and Ga, which is grown on the substrate.

18. A method of manufacturing a semiconductor device comprising the steps of:
    forming a groove in a predetermined portion of a substrate; and
    growing a nitride-based group III-V compound semiconductor layer including at least In and Ga on the substrate.

19. A semiconductor device comprising:
    a substrate in which a groove is provided in a predetermined portion; and
    a nitride-based group III-V compound semiconductor layer grown on the substrate and including at least In and Ga, in which band gap energy is changed in at least one direction along a surface of the substrate near the groove.

* * * * *